United States Patent [19]

Takai et al.

[11] Patent Number: 5,360,484
[45] Date of Patent: Nov. 1, 1994

[54] MICROWAVE PLASMA CVD APPARATUS PROVIDED WITH A MICROWAVE TRANSMISSIVE WINDOW MADE OF SPECIFIC CERAMICS FOR THE FORMATION OF A FUNCTIONAL DEPOSITED FILM

[75] Inventors: Yasuyoshi Takai; Tetsuya Takei; Hirokazu Otoshi, all of Nagahama; Ryuji Okamura, Shiga, all of Japan

[73] Assignee: Canon Kabushiki Kaisha, Tokyo, Japan

[21] Appl. No.: 63,048

[22] Filed: May 19, 1993

Related U.S. Application Data

[63] Continuation of Ser. No. 915,658, Jul. 21, 1992, abandoned.

[30] Foreign Application Priority Data

Jul. 26, 1991 [JP] Japan .................. 3-187650

[51] Int. Cl.$^5$ ............................. C23C 16/50
[52] U.S. Cl. .............. 118/723 MW; 118/723 ME; 333/99 PL
[58] Field of Search ............... 118/723 MW, 723 ME, 118/723 MR, 723 MA; 315/111.21, 111.41; 333/252, 99 PL; 501/153

[56] References Cited

U.S. PATENT DOCUMENTS

| | | |
|---|---|---|
| 4,217,337 | 8/1980 | Yamada et al. .................. 501/153 |
| 4,504,518 | 3/1985 | Ovshinsky et al. ................ 427/38 |
| 4,735,926 | 4/1988 | Ando et al. ..................... 501/127 |
| 4,785,763 | 11/1988 | Saitoh ......................... 118/723 |
| 4,857,809 | 8/1989 | Torii et al. ............... 315/111.41 X |
| 4,930,442 | 9/1990 | Iida et al. ..................... 118/723 |
| 5,030,476 | 7/1991 | Okamura et al. ................. 427/39 |
| 5,114,770 | 5/1992 | Echizen et al. ................. 427/575 |
| 5,129,359 | 7/1992 | Takei et al. ................... 118/723 |
| 5,136,272 | 8/1992 | Kormann et al. ................. 333/252 |

FOREIGN PATENT DOCUMENTS

| | | |
|---|---|---|
| 60-186849 | 9/1985 | Japan . |
| 64-56873 | 3/1989 | Japan . |
| 01-56873 | 3/1989 | Japan . |

*Primary Examiner*—R. Bruce Breneman
*Assistant Examiner*—Jonathan D. Baskin
*Attorney, Agent, or Firm*—Fitzpatrick, Cella, Harper & Scinto

[57] ABSTRACT

An improved microwave plasma CVD apparatus for forming a functional deposited film which is provided with a microwave transmissive window composed of a sintered alpha-alumina ceramics body containing alpha-alumina as a matrix comprised of fine particles with a mean particle size d satisfying the equation $0.5\ \mu m \leq d \leq 50\ \mu m$ and with a ratio of $\rho_2/\rho_1$ between the theoretical density $\rho_1$ and the bulk density $\rho_2$ satisfying the equation $0.800 \leq \rho_2/\rho_1 \leq 0.995$.

4 Claims, 5 Drawing Sheets

F I G. 2
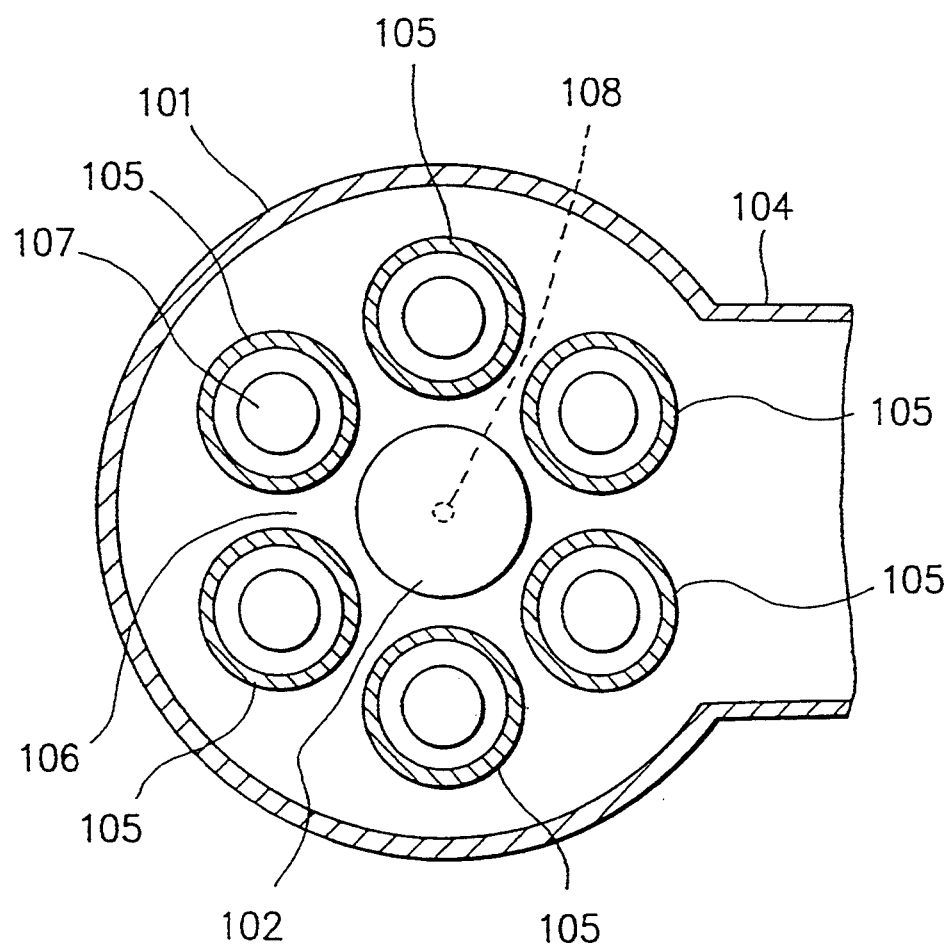

MICROWAVE PLASMA CVD APPARATUS PROVIDED WITH A MICROWAVE TRANSMISSIVE WINDOW MADE OF SPECIFIC CERAMICS FOR THE FORMATION OF A FUNCTIONAL DEPOSITED FILM

This application is a continuation of application Ser. No. 07/915,658 filed Jul. 21, 1992, now abandoned.

BACKGROUND OF THE INVENTION

1. Field of the Invention

The present invention relates to a microwave plasma CVD apparatus which makes it possible to effectively form a functional amorphous film on a substrate, which is eligible to use as a constituent semiconductor member of semiconductor devices, electrophotographic photosensitive devices, image input line sensors, image pickup devices, photovoltaic devices, other various electronic and optical devices, etc. More particularly, the present invention relates to an improved microwave plasma CVD apparatus provided with a microwave transmissive window composed of specific sintered ceramics comprising alpha-alumina as the main constituent which enables one to continuously form an amorphous semiconductor film on a substrate over a long period of time without the microwave transmissive window being deteriorated.

2. Related Background Art

Heretofore, there have been proposed a number of amorphous semiconductor deposited films such as amorphous silicon deposited films respectively composed of an amorphous silicon material compensated with hydrogen atoms (H) or/and halogen atoms (X) such as fluorine, chlorine, etc. (hereinafter referred to as "a-Si(H,X)"). Some of such films have been put to practical use as a constituent element member of semiconductor devices, electrophotographic photosensitive devices, image input line sensors, image pickup devices, photovoltaic devices, other various electronic and optical devices.

It is known that such semiconductor deposited films may be obtained by means of a sputtering process, a thermal-induced CVD, a light-induced CVD process or a plasma CVD process, that is, a glow discharge decomposition process in other words, in which a deposited film is formed on a substrate of glass, quartz, heat-resistant resin, stainless steel or aluminum by decomposing a film-forming raw material gas with a glow discharge using a direct current (DC) energy, a high frequency energy or a microwave energy. In recent years, the public attention has been focused on the glow discharge decomposition process using a direct current energy, a high frequency energy or a microwave energy at industrial level since an amorphous semiconductor deposited film may be relatively easily formed at a relatively low substrate temperature while controlling the quality of the film. Particularly, the glow discharge decomposition process using a microwave energy (that is, microwave plasma CVD process) has been evaluated as being the most appropriate since it is remarkably advantageous over other plasma CVD processes with the points that film deposition rate is high and utilization efficiency of a film-forming raw material gas is high.

There have been made a number of proposals utilizing the above advantages of the microwave plasma CVD process. For example, U.S. Pat. No. 4,504,518 (hereinafter referred to as Literature 1) describes a microwave plasma CVD process of forming an amorphous semiconductor alloy film on a substrate by coupling a microwave energy into a substantially enclosed reaction vessel containing the substrate, at the same time introducing into the reaction vessel at least one reaction gas of $SiH_4$, $SiF_4$, $GeH_4$, etc. to form a glow discharge plasma within the reaction vessel to form reaction gas species from the reaction gas, and evacuating the reaction vessel to a deposition pressure so as to provide for the deposition of an amorphous semiconductor alloy film from the reaction gas species onto the substrate at high deposition rate with high reaction gas conversion efficiency. Literature 1 also describes that the resulting amorphous semiconductor alloy film may be controlled to a conduction of p-type or n-type by adding a dopant gas during the formation thereof. In addition, Japanese Laid-open patent application 60(1985)-186849 (U.S. Ser. No. 580,086) (hereinafter referred to as Literature 2) describes a microwave plasma CVD process and a microwave plasma CVD apparatus for producing an electrophotographic device. The microwave plasma CVD apparatus in Literature 2 includes a discharge space wherein a plurality of cylindrical substrates are arranged to surround a microwave introducing means, thereby highly enhancing the gas utilization efficiency.

Now, in order to effectively form a desirable amorphous semiconductor film by the microwave plasma CVD process while making full-use of the above-mentioned advantages, the microwave transmissive window as the microwave introducing means through which a microwave energy is applied into the film-forming chamber is one of the essentially important factors. Hitherto, there have been used for the microwave transmissive window, materials having a low dielectric constant (E) and a low dielectric loss angle (tan δ) to prevent transmission loss of the microwave as much as possible. Such materials are berylia (BeO), polytetrafluoroethylene, alumina ceramics, etc.

It is required for the microwave transmissive window to have sufficient resistances to, discharged heat radiation, to temperature rise at the window due to absorption of microwave and also to thermal impact. Other than these requirements, it is also required for the microwave transmissive window to have a sufficient vacuum retentivity. Further in addition, it is required for the microwave transmissive window to maintain its microwave transmission without being reduced even when a film is deposited on the surface thereof facing to the discharge space.

The conventional microwave transmissive windows made of those materials above mentioned are not satisfactory since they do not sufficiently meet the above requirements. In view of this, there have been made various proposals of the microwave transmissive window.

For example, U.S. Pat. No. 4,785,763 (hereinafter referred to as Literature 3) describes a microwave plasma CVD apparatus provided with a microwave introducing means comprised of laminated two or more microwave transmissive plates made of a dielectric material wherein the face of the outermost transmissive plate to become faced to the deposition space is of a toughened surface having a roughness of 1.5 μm to about 1 cm for the height between the projection and the depression by the arithmetic mean for at least selected ten points. Literature 3 describes advantages provided by using said microwave introducing means that an amorphous material deposited on the roughened surface is hardly crystallized even when its temperature is elevated and a microwave energy is effectively introduced into the deposition space without reflected at the microwave transmissive plate even in the case of repeating the film forming process.

Other than this, U.S. Pat. No. 4,930,442 (hereinafter referred to as Literature 4) describes a microwave plasma CVD apparatus provided with an improved microwave transmissive window made of alumina ceramics containing glassy component such as $SiO_2$, CaO and MgO in an amount of 1 wt. % to 10 wt. % and substantially as other component α-alumina. Literature 4 describes that said microwave transmissive window excels in heat resistance, heat impact resistance, vacuum retentivity and microwave power transmittance characteristics.

These improved techniques relative to the microwave introducing window of the microwave plasma CVD apparatus has made it possible to form a relatively thick photoconductive material at a relatively high deposition rate and with relatively high raw material gas utilization efficiency.

An example of such known microwave plasma CVD apparatus is of the constitution shown in FIG. 4 and FIG. 5. FIG. 4 is a schematic explanatory view illustrating the constitution of the known microwave plasma CVD apparatus, and FIG. 5 is a schematic cross section view taken along line X—X of the apparatus shown in FIG. 4.

In FIGS. 4 and 5, numeral reference 401 stands for a substantially enclosed reaction chamber (film-forming chamber in other words) having a vacuum tight structure, the inside of which can be evacuated to a vacuum of $1 \times 10^{-7}$ Torr or less. The reaction chamber 401 is so structured that it serves as a cavity resonator capable of resonating with a frequency from a microwave power source (not shown) to initiate discharge by way of self-excited discharge without using a discharging trigger or the like. Numeral reference 402 stands for a microwave introducing window comprising the foregoing microwave introducing means of Literature 3 or the foregoing microwave transmissive window of Literature 4 which is capable of transmitting a microwave power from the microwave power source (not shown) into the reaction chamber 401. The microwave introducing window 402 is arranged to a waveguide 403 so as to vacuum-tight the inside of the reaction chamber 401 and to isolate the inside of the waveguide 403 from the inside of the reaction chamber 401. The waveguide 403 is connected to the microwave power source (not shown) through a stab tuner (not shown) and an isolator (not shown). The waveguide 403 comprises a rectangular-shaped portion extending from the microwave power source (not shown) to the vicinity of the reaction chamber 401 and a cylindrically-shaped portion situated in the reaction chamber 401.

The reaction chamber 401 is provided with an exhaust pipe 404 which is connected to an exhaust device (not shown) through an exhaust valve (not shown). Numeral reference 405 stands for cylindrical substrates on each of which a film is to be formed. Each of the cylindrical substrates 405 is supported on a substrate holder 405' arranged on a rotary shaft 410 connected to a driving motor 411 through a driving mechanism. Numeral reference 406 stands for a discharge space surrounded by the cylindrical substrates 405. Numeral reference 408 stands for a gas feed pipe for supplying a raw material gas into the discharge space 406. The gas feed pipe 408 is connected to gas reservoirs (not shown). Each of the substrate holders 405' is provided with an electric heater 407 for heating the cylindrical substrate 405 positioned thereon.

The formation of a deposited film in this microwave plasma CVD apparatus in order to prepare an electrophotographic photosensitive device is carried out in the following manner.

There are firstly provided a plurality of well-cleaned cylindrical substrates 405. Each of these cylindrical substrates 405 is positioned on the corresponding substrate holder 405' of the reaction chamber 401. After the reaction chamber 401 being closed, the reaction chamber 401 is evacuated to bring the inside to a vacuum of less than $1 \times 10^{-7}$ Torr through the exhaust pipe 404 by means of the exhaust device (not shown). Subsequently, each of the cylindrical substrates 405 is heated to a desired temperature by means of the electric heater, and is maintained at this temperature. Film-forming raw material gases (for example, silane gas ($SiH_4$) and hydrogen gas ($H_2$) in the case of forming an amorphous silicon film) are introduced into the reaction chamber 401 through the gas feed pipe 408 at respective predetermined flow rates. Simultaneously, the microwave power source (not shown) is switched on to generate a microwave having a frequency of not less than 500 MHz, preferably 2.45 GHz, followed by transmission through the waveguide 403 and the microwave introducing window 402 into the reaction chamber 401. In this way, the film-forming raw material gases are excited and decomposed by the action of the microwave energy in the discharge space 406 surrounded by the cylindrical substrates 405, to produce neutral radical particles, ion particles, electrons, etc. which are reacted with each other to cause the formation of a deposited film on each of the cylindrical substrates 405. During this process, each of the cylindrical substrates 405 is rotated by rotating the rotary shaft 410 by means of the driving motor 411. As a result, there is formed a deposited film uniformly on the entire surface of each of the cylindrical substrates.

In the case of forming a photoconductive material by a microwave plasma CVD process in order to produce an electrophotographic photosensitive device by using the known microwave plasma CVD apparatus shown in FIGS. 4 and 5 which is provided with a microwave introducing window comprising the foregoing microwave introducing means of Literature 3 or the foregoing microwave transmissive window of Literature 4, the microwave introducing window comprising the foregoing microwave introducing means of Literature 3 or the foregoing microwave transmissive window of Literature 4 is practically effective to a certain extent.

However, as a result of experimental studies of the microwave introducing window by the present inventors, the following facts were found. That is, the microwave introducing window is not satisfactory particularly in durability upon repeated reuse. Particularly, the microwave introducing window comprising the foregoing microwave introducing means of Literature 3 or the foregoing microwave transmissive window of Literature 4 is still problematic upon repeated reuse by repeating the reuse cycle comprising use for film formation, removal of the deposited film and reuse for the next film formation. That is, as the repetition of the reuse cycle thereof increases, there are provided problems that discharge is hardly caused, discharge is not stably maintained, and the microwave introducing window becomes deteriorated particularly in terms of durability. Therefore, there is still a subject for the microwave introducing window comprising the foregoing microwave introducing means of Literature 3 or the foregoing microwave transmissive window of Literature 4 to be improved particularly not only in view of durability upon repeated reuse but also in view of the characteristics as the microwave introducing means. And, this subject is very important in order to mass-produce a desirable electrophotographic photosensitive device of high quality with high yield and at a reduced production cost.

Explaining the above situation in more detail, in the case of producing an amorphous silicon electrophotographic photosensitive device using the above microwave plasma CVD apparatus, it usually takes at least two hours for the formation of its photoconductive layer wherein a film is deposited at a relatively high thickness on the surface of the microwave introducing window which is exposed to plasma. Therefore, the surface of the microwave introducing window having such deposited film thereon is cleaned to remove the deposited film by means of an alkali etching technique or a sand blasting technique after every film formation cycle, and the microwave introducing window thus cleaned is subjected to reuse for the next film formation cycle. As above described, as the repetition of the reuse cycle of the microwave introducing window in this way increases, the microwave introducing introducing window itself not only becomes gradually deteriorated but also the surface thereof is gradually shaved off, and the microwave introducing window is contaminated with alkali in the case of performing alkali etching in order to remove the film deposited on the surface thereof, to thereby cause the following problems. That is, firstly, discharge becomes hardly caused. Particularly, in this case, it is necessary to apply excessive microwave power in order to cause and continue discharge, but the resulting film becomes accompanied by defects and as a result, the yield is reduced. Secondly, stable discharge cannot be maintained. As above described, it takes at least two hours for the formation of an photoconductive layer in order to produce an amorphous silicon electrophotographic photosensitive drum, wherein discharge is necessary to be maintained in a stable state during the formation of the photoconductive layer. However, when discharge is intermittently gone out or is caused in an unstable state, the resulting film becomes accompanied by defects and as a result, the yield is reduced. Thirdly, the durability of the microwave introducing window against the severe conditions upon film formation becomes deteriorated. In this case, the microwave introducing window sometimes becomes damaged or broken in the worst case during discharging.

SUMMARY OF THE INVENTION

The principal object of the present invention is to overcome the foregoing problems of the known microwave plasma CVD apparatus and to provide an improved microwave plasma CVD apparatus which is free of those problems particularly relative to the microwave introducing window which are found in the known microwave plasma CVD apparatus.

Other object of the present invention is to provide an improved microwave plasma CVD apparatus provided with an improved microwave introducing window which enables to effectively and continuously form a high quality functional deposited film at a high yield, which is eligible to use as a constituent element member in semiconductor devices, electrophotographic photosensitive devices, image input line sensors, image pickup devices, photovoltaic devices, other various electronic and optical devices.

A further object of the present invention is to provide an improved microwave plasma CVD apparatus provided with an improved microwave introducing window which enables to reduce the consumption of a microwave power for causing discharge to produce plasma and to continuously cause desirable discharge in a stable state and which enables to effectively and continuously form a high quality functional deposited film at a high yield.

A further object of the present invention is to provide an improved microwave plasma CVD apparatus provided with an improved microwave introducing window having a sufficient durability in the repetition of reuse cycle comprising use for film formation, removal of the film deposited on the surface thereof and reuse for the next film formation and which enables to continuously cause desirable discharge in a stable state even after the repetition of reuse cycle many times.

A further object of the present invention is to provide an improved microwave plasma CVD apparatus provided with an improved microwave introducing window having a sufficient durability in the repetition of reuse cycle comprising use for film formation, removal of the film deposited on the surface thereof and reuse for the next film formation and which enables to continuously cause desirable discharge in a stable state and to effectively and continuously form a high quality functional deposited film at a high yield even after the repetition of reuse cycle many times.

BRIEF DESCRIPTION OF THE DRAWINGS

FIG. 2 is a schematic cross section view taken along line X—X of the apparatus shown in FIG. 1.

DETAILED DESCRIPTION OF THE INVENTION

In order to attain the above objects, the present inventors have made extensive studies through experiments, which will be later described, while focusing on the microwave introducing window of the conventional microwave plasma CVD apparatus having advantages of high deposition rate and high raw material gas utilization efficiency. As a result, it has been found that when the microwave introducing window (microwave transmissive window) is constituted by a specific material of which microstructure being properly controlled, particularly a specific material comprising sintered ceramics containing alpha-alumina as a matrix which is comprised of fine particles of a specific mean particle size with a specific density, the above objects can be effectively attained.

The present invention has been accomplished based on this finding. The present invention provides an improved microwave plasma CVD apparatus for the formation of a functional deposited film which attains the above objects.

The microwave plasma CVD apparatus provided according to the present invention comprises a substantially enclosed deposition chamber having a deposition space including a discharge space, a supporting means for a substrate on which a functional deposited film is to be formed, said supporting means being disposed in said deposition space, means for supplying a raw material gas into said deposition space, means for evacuating the inside of said deposition chamber, and a microwave introducing means for applying microwave energy into said discharge space to form discharge plasma therein, said microwave introducing means comprising a microwave transmissive window to which a waveguide extending from a microwave power source being connected, characterized in that said microwave transmissive window is composed of sintered ceramics containing alpha-alumina as a matrix comprised of fine particles with a mean particle size d satisfying the equation $0.5 \mu m \leq d \leq 50 \mu m$ and with a ratio of $\rho_2/\rho_1$ between the theoretical density $\rho_1$ and the bulk density $\rho_2$ satisfying the equation $0.800 \leq \rho_2/\rho_1 \leq 0.995$.

In the following, the foregoing experiments which were carried out by the present inventors will be described.

In the following experiments, there was used a microwave plasma CVD apparatus of the constitution shown in FIG. 1 and FIG. 2.

Figure 1:
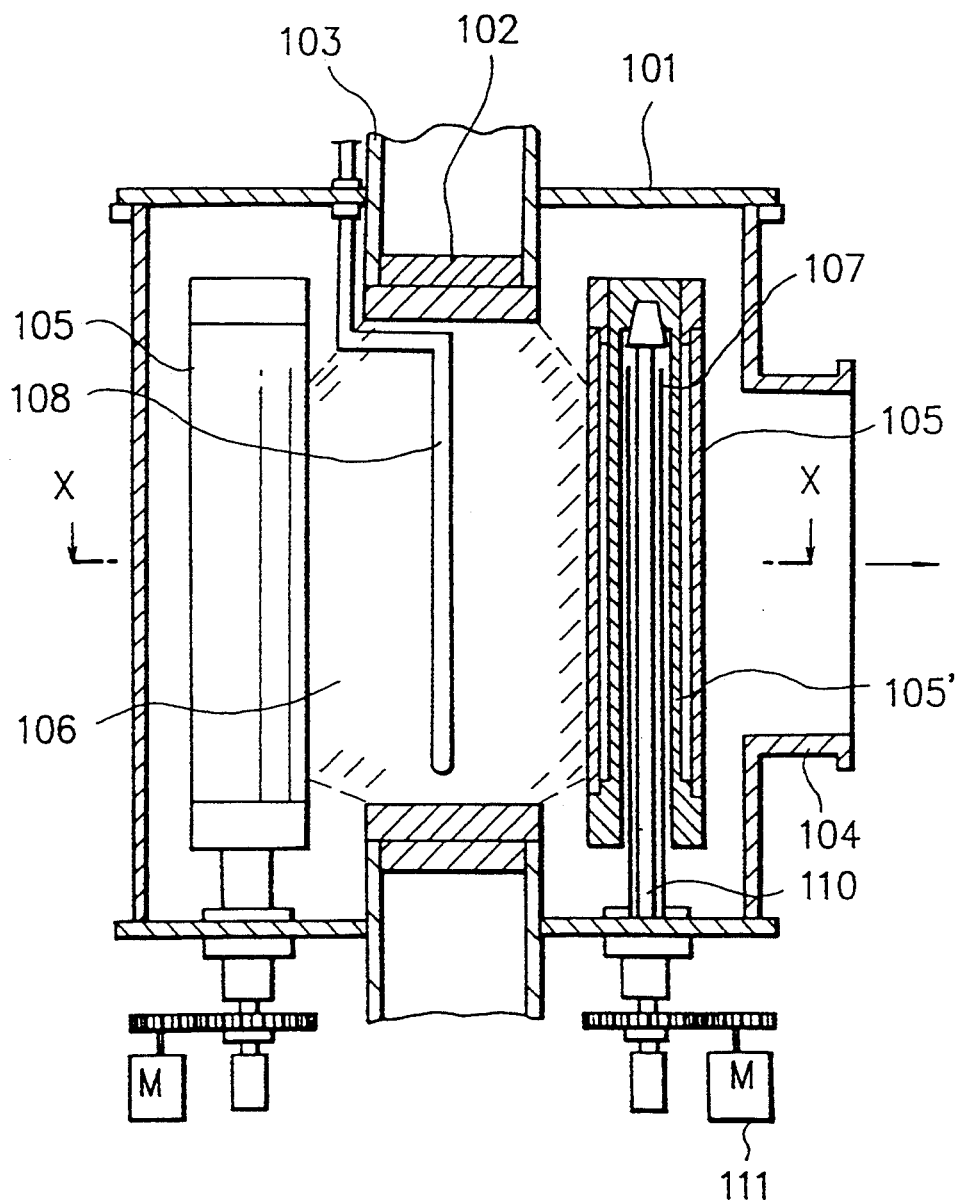
FIG. 1 is a schematic explanatory view illustrating the constitution of a microwave plasma CVD apparatus used in the experiments which will be later described.

FIG. 1 is a schematic explanatory view illustrating the constitution of the microwave plasma CVD apparatus, and FIG. 2 is a schematic cross section view taken along line X—X of the apparatus shown in FIG. 1.

In FIGS. 1 and 2, numeral reference 101 stands for a substantially enclosed reaction chamber (film-forming chamber in other words) having a vacuum tight structure, the inside of which can be evacuated to a vacuum of $1 \times 10^{-7}$ Torr or less. The reaction chamber 101 is so structured that it serves as a cavity resonator capable of resonating with a frequency from a microwave power source (not shown) to initiate discharge by way of self-excited discharge without using a discharging trigger or the like. Numeral reference 102 stands for a microwave transmissive window (microwave introducing window) in the form of a rectangular or round shape which is capable of transmitting a microwave power from the microwave power source (not shown) into the reaction chamber 101 therethrough. The microwave transmissive window 102 is arranged to a waveguide 103 so as to vacuum-tight the inside of the reaction chamber 101 and to isolate the inside of the waveguide 103 from the inside of the reaction chamber 101. The waveguide 103 is connected to the microwave power source (not shown) through a stab tuner (not shown) and an isolator (not shown). The waveguide 103 comprises a rectangular-shaped portion extending from the microwave power source (not shown) to the vicinity of the reaction chamber 101 and a cylindrically-shaped portion situated in the reaction chamber 101.

The reaction chamber 101 is provided with an exhaust pipe 104 which is connected to an exhaust device (not shown) through an exhaust valve (not shown). Numeral reference 105 stands for cylindrical substrates on each of which a film is to be formed. Each of the cylindrical substrates 105 is supported on a substrate holder 105' arranged on a rotary shaft 110 connected to a driving motor 111 through a driving mechanism. Numeral reference 106 stands for a discharge space surrounded by the cylindrical substrates 105. Numeral reference 108 stands for a gas feed pipe for supplying a raw material gas into the discharge space 106. The gas feed pipe 108 is connected to gas reservoirs (not shown). Each of the substrate holders 105' is provided with an electric heater 107 for heating the cylindrical substrate 105 positioned thereon.

Figure 3A:
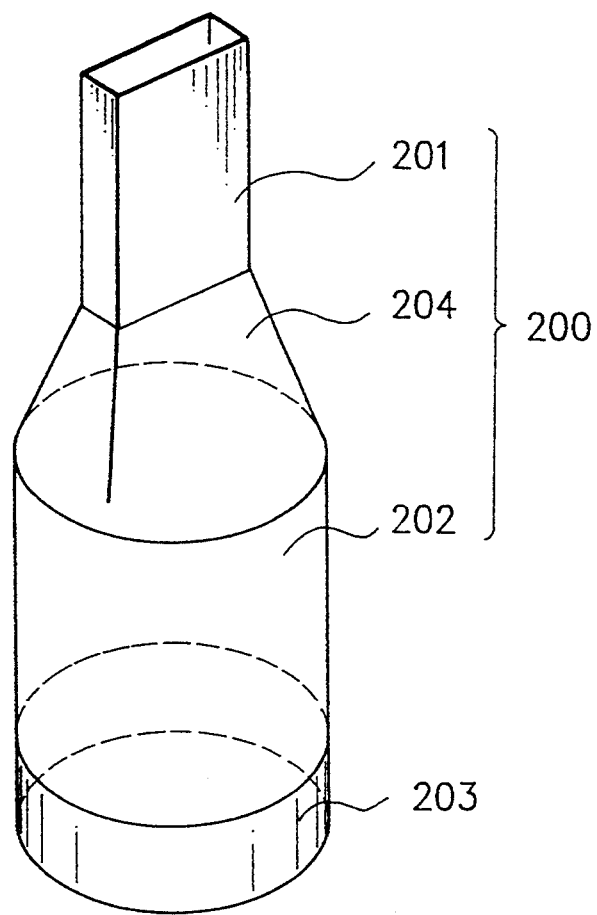
FIG. 3(A) is a schematic view of an embodiment of the microwave introducing means comprising a microwave transmissive window integrated to a waveguide in the present invention.
Figure 3B:
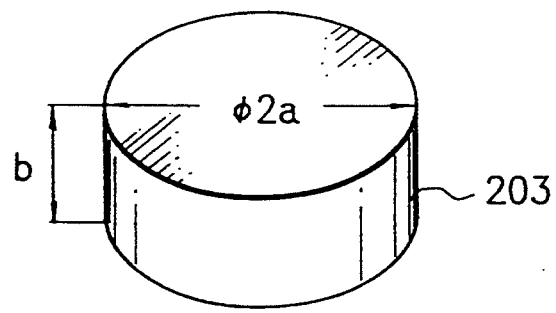
FIG. 3(B) is a schematic view illustrating an embodiment of the microwave transmissive window shown in FIG. 3(A).
Figure 4:
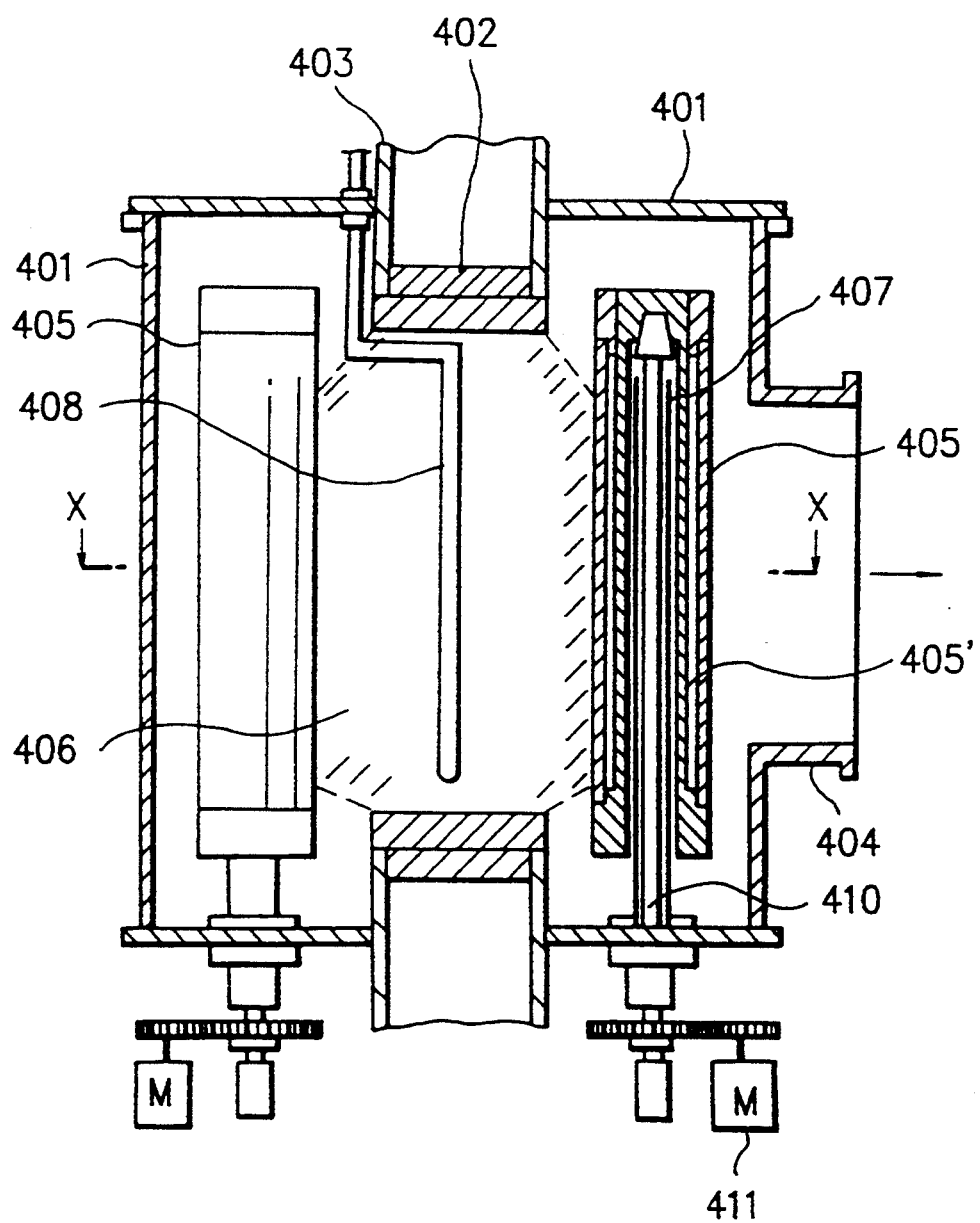
FIG. 4 is a schematic explanatory view illustrating the constitution of the known microwave plasma CVD apparatus.
Figure 5:
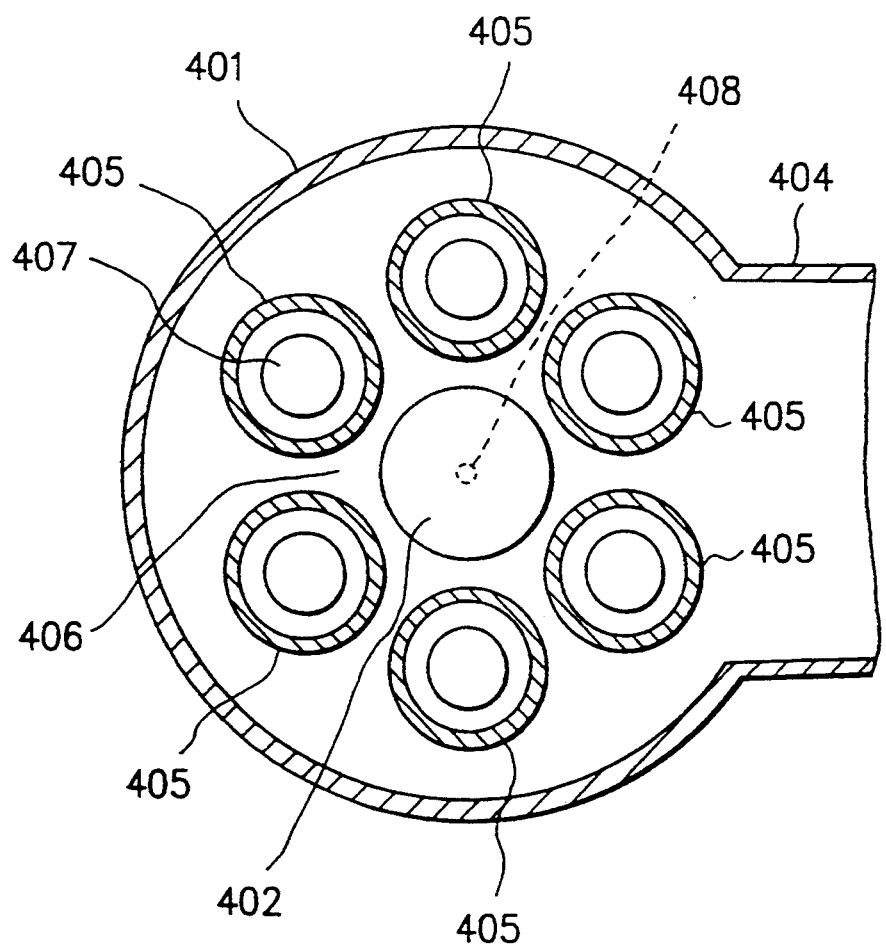
FIG. 5 is a schematic cross section view taken along line X—X of the apparatus shown in FIG. 4.

In the following experiments, the microwave introducing means comprising the waveguide 103 and the microwave transmissive window 102 being integrated to the waveguide 103 of the microwave plasma CVD apparatus shown in FIGS. 1 and 2 was replaced by a microwave introducing means of the constitution schematically shown in FIG. 3(A) and FIG. 3(B). FIG. 3(A) is a schematic diagram of the entire of the microwave introducing means which comprises (a) a waveguide portion 200 comprising a rectangular waveguide 201 extending from a microwave power source (not shown), a horn-shaped converter 204 and a circular waveguide 202 and (b) a round-shaped microwave transmissive window 203 being integrated to the waveguide portion 200. FIG. 3(B) is a schematic explanatory view of the round-shaped microwave transmissive window 203 shown in FIG. 3(A) which has a thickness b and a diameter $2a$ with a being a radius.

The waveguide portion 200 may be comprised of the rectangular waveguide 201 and the circular waveguide 202 without the horn-shaped converter 204. In a further alternative, the waveguide portion 200 may be comprised of the rectangular waveguide 201.

EXPERIMENT 1

As the microwave transmissive window 203, there were provided 10 microwave transmissive windows respectively composed of a different sintered alpha-alumina ceramics body.

(1) Preparation of a microwave transmissive window

Firstly, there was provided powdery alpha-alumina of 97% in purity. The powdery alpha-alumina was subjected to classification by means of a conventional classifier to obtain powdery alpha-alumina of a particle size distribution in close proximity to the logarithmic normal distribution and which satisfies the following equations (1) and (2).

$$F(x) = \frac{1}{\sqrt{2\pi} \log \sigma} \int \exp\left(-\frac{(\log x - \log x_{ave})^2}{2\log^2 \sigma}\right) dx \quad (1)$$

$$\sigma = \left(\sum_{i=1}^{n} \frac{(x_i - x_{ave})^2}{n}\right)^{\frac{1}{2}} \quad (\log \sigma \leq 2) \quad (2)$$

wherein F(x) is the logarithmic normal distribution, $\sigma$ is a standard deviation, x is a particle size of each of the alumina particles, and $x_{ave}$ is a mean particle size of the alumina particles.

The above equations (1) and (2) mean that at least 68.3% of the entire of the alumina particles is ranging in the range of 1/100 to 100 times over the mean particle size $x_{ave}$.

The powdery alpha-alumina thus obtained was processed by means of a conventional hot rolling technique at a different processing pressure in the range of 300 to 1500 kgf/cm² and at a different sintering temperature in the range of 700° to 2000° C. Thus, there were obtained 10 microwave transmissive window samples respectively composed of a different sintered alpha-alumina ceramics body of a different mean particle size as shown in Table 2 (Samples Nos. 1 to 10) of the shape shown in FIG. 3(B).

The mean particle size of each of Samples Nos. 1 to 10 herein was measured by a conventional planimetric method, wherein an Au thin film was deposited on the surface and a broken-out section thereof by means of a conventional vacuum evaporation technique and the resultant was observed by a scanning electron microscope.

As for each of Samples Nos. 1 to 10, the bulk density (the value obtained by dividing the mass by the volume containing cracks, open pores, closed pores, and the like) and the apparent density (the value obtained by dividing the mass by the volume containing neither cracks nor open pores but containing closed pores) were examined, and as a result, it was found that the apparent density is approximate to the theoretical density (the value obtained by dividing the mass by the volume not containing cracks, open pores, closed pores, and the like). Each of the bulk density and the apparent density herein was obtained by a conventional Archimedes method.

(2) Each of the 10 microwave transmissive window samples (Samples Nos. 1 to 10) obtained in the above was examined in the following manner.

Each of Samples Nos. 1 to 10 was used as the microwave transmissive window 203 of the microwave introducing means of the microwave plasma CVD apparatus shown in FIGS. 1 and 2. And discharge was caused in each case under the conditions shown in Table 1 to examine the situation of discharge stability, wherein the period of time (endurance time) for the discharge to have been maintained until the discharge discontinued due to breakage of the microwave transmissive window was also examined. The results obtained were collectively shown in Table 2. In Table 2, the mark ⊙ indicates the case of 150 minutes or more for the endurance time, the mark ○ indicates the case of more than 110 minutes but less than 150 minutes for the endurance time, the mark △ indicates the case of more than 60 minutes but less than 110 minutes for the endurance time, and the mark x indicates the case of less than 60 minutes for the endurance time.

As Table 2 illustrates, as for the sintered alpha-alumina ceramics bodies used as the microwave transmissive window 203, it was found that those of a mean particle size in the range of 0.5 μm to 50 μm excel in heat resistance and discharge stability, and among them, those of a mean particle size in the range of 1 μm to 30 μm extremely excel in heat resistance and discharge stability.

Separately, the parameters in the preparation of a microwave transmissive window (1), the control of the particle size of the starting powdery alpha-alumina, the control of the distributed state, the processing temperature, the sintering temperature and the sintering period, were properly changed to obtained a plurality of microwave transmissive windows respectively composed of a different sintered alpha-alumina ceramics body of a mean particle size in the above range. And each of these microwave transmissive windows was examined in the same manner as in the above (2). As a result, there were obtained satisfactory results similar to those in the above.

Further, each of the outer most plate of Literature 3 and the microwave transmissive window of Literature 4 was subjected to the discharge test in the same manner as in the above, and as a result, the results were similar to those obtained in the case of Sample 10.

The surface texture of each of the outer most plate of Literature 3 and the microwave transmissive window of Literature 4 was examined by an electron microscope. As a result, it was found that the surface texture of each of them comprises particles of a varried particle size and some abnormally grown particles of a varried particle size greater by about 10 times over the average particle size. As for the reason of this, it is considered that the preparation of each of the outer most plate of Literature 3 and the microwave transmissive window of Literature 4 is performed without employing such step of controlling the particle size of the starting powdery material as in the above (1). On the other hand, it was found that the surface texture of each of Samples Nos. 2 to 9 comprises particles of a substantially identical particle size without any abnormally grown particle.

On the basis of the above findings, it was found that as for the microwave introducing window (microwave transmissive window) to be exposed to plasma during film formation, the smaller the mean particle size of the starting powdery material from which the microwave transmissive window is formed is, the greater the fracture strength is; it is basically important for the starting powdery material from which the microwave transmissive window is formed to be comprised of particles having an even particle size in order to make the resulting microwave transmissive window to have a sufficient durability which is neither deteriorated nor damaged upon exposing to discharge plasma continuously over a long period of time; and if the microwave transmissive window's surface to be exposed to discharge plasma contains abnormally grown particles, the microwave transmissive window is apt to be deteriorated or damaged upon exposing to discharge plasma continuously over a long period of time.

Further, from the findings based on the results shown in Table 2, it was found that the microwave transmissive window composed of a sintered alpha-alumina ceramics body having a mean particle size of less than 0.5 μm is inferior particularly in view of fracture strength. For the reason of this, it is considered that in the case of using a powdery alpha-alumina of an excessively small mean particle size for the formation of a microwave transmissive window by means of the foregoing hot rolling technique, the powdery alpha-alumina is not well sintered.

From what above described, the following were found. That is, (i) there is a limit for the range of the mean particle size of a sintered alpha-alumina ceramics body to be used for the preparation of a desirable microwave transmissive window for use in the microwave plasma CVD apparatus; (ii) such range of the mean particle size as for the sintered alpha-alumina ceramics body which makes it possible to obtain a desirable microwave transmissive window is preferably from 0.5 μm to 50 μm and more preferably, from 1 μm to 30 μm; (iii) in addition to the limit described in the above (i), there is also a limit for the uniformity of particle sizes of the particles of a sintered alpha-alumina ceramics body to be used for the preparation of a desirable microwave transmissive window for used in the microwave plasma CVD apparatus, and (iv) such uniformity of particle sizes of the particles of a sintered alpha-alumina ceramics body to be used for the preparation of a desirable microwave transmissive window is is desired to be such that the maximum particle size of the particles of the sintered alpha-alumina ceramics body is preferably 5 times or below, more preferably 3 times or below, and most preferably, 2 times or below over the mean particle of the particles of the sintered alpha-alumina ceramics body.

EXPERIMENT 2

There were prepared 8 microwave transmissive window samples (Samples Nos. 11 to 18) respectively composed of a different alpha-alumina sintered body having a mean particle size of about 3 μm and a different ratio of bulk density/theoretical density in the range of 0.750 to 0.998 by repeating the procedures for the preparation of a microwave transmissive window of (1) in Experiment 1, wherein the processing pressure was changed in the range of 300 to 1500 kgf/cm² and the sintering temperature was changed in the range of 700° to 2000° C.

Each of the 8 microwave transmissive window samples (Samples Nos. 11 to 18) obtained in the above was examined in the following manner.

Each of Samples Nos. 11 to 18 was used as the microwave transmissive window 203 of the microwave introducing means of the microwave plasma CVD apparatus shown in FIGS. 1 and 2. And discharge was caused in each case under the conditions shown in Table 3 to examine the situation of the stability of discharge caused and ease of causing discharge. As for the ease of causing discharge, it was evaluated based on the minimum microwave power required for initiating discharge.

In the above discharge test, each of the 8 microwave transmissive window samples was subjected to the discharge test in the following manner.

That is, the microwave transmissive window sample was used to cause discharge in the microwave plasma CVD apparatus shown in FIGS. 1 and 2; thereafter the microwave transmissive window sample was taken out from the apparatus and it was immersed in a NaOH aqueous solution having a pH value of 13 for an hour while maintaining the system at 60 ° C., washed with pure water for 30 minutes, followed by drying at 150° C. for an hour; it was then subjected to sand blasting using an abrasive material made of glass at a pressure of 6 kg/cm² for 3 minutes; and then it was installed in the above microwave plasma CVD apparatus and the above discharging was performed. This cycle was repeated 10 times. The situation of the stability of discharge caused and the ease of causing discharge were examined in every cycle. The evaluated results obtained were collectively shown in Table 4.

In Table 4, with respect to the the ease of causing discharge, the mark ⊙ indicates the case where the discharge initiating microwave power was less than 1000 W, the mark ○ indicates the case where the discharge initiating microwave power was in the range of 1000 to 1500 W, the mark Δ indicates the case where the discharge initiating microwave power was in the range of 1500 to 2500 W, and the mark x indicates the case where the discharge initiating microwave power was higher than 2500 W.

With respect to the situation of the stability of discharge caused, the discharging was continuously performed for 4 hours, wherein abnormal phenomena of discharge such as extinction of discharge, occurrence of abnormal discharge, and the like were observed. The mark ⊙ indicates the case where discharge was stably maintained during the 4 hours, the mark ○ indicates the case where discharge was about to go out several times, the mark Δ indicates the case where discharge went out several times, and the mark x indicates the case where discharge frequently went out and discharge was not continued, wherein the discharging was terminated before the 4 hours lapsed.

As for each of Samples Nos. 11 to 18, the bulk density (the value obtained by dividing the mass by the volume containing cracks, open pores, closed pores, and the like) was examined, and as a result, it was found to be approximate to the theoretical density (the value obtained by dividing the mass by the volume not containing cracks, open pores, closed pores, and the like). Each of the bulk density and theoretical density herein was obtained by a conventional Archimedes method.

The mean particle size of each of Samples Nos. 11 to 18 was measured by a conventional planimetric method, wherein an Au thin film was deposited on the surface and a broken-out section thereof by means of a conventional vacuum evaporation technique and the resultant was observed by a scanning electron microscope.

From the results shown in Table 4, it was found that the ease of causing discharge and the stability of discharge caused in the repetition of reuse cycle comprising use for the discharging for film formation, removal of the film deposited on the surface of the microwave transmissive window and reuse for the next discharging for film formation are correlated to the density of the microwave transmissive window. Particularly, as apparent from what shown In Table 4, it was found that in order for the microwave transmissive window to be satisfactorily durable in the repetition of reuse cycle comprising use for the discharging for film formation, removal of the film deposited on the surface of the microwave transmissive window and reuse for the next discharging for film formation, the constituent sintered alpha-alumina ceramics body of the microwave transmissive window is desired to be of a ratio of bulk density/theoretical density preferably in the range of 0.800 to 0.995 and more preferably in the range of 0.900 to 0.990.

Separately, the parameters in the above preparation of a microwave transmissive window, the control of the particle size of the starting powdery alpha-alumina, the control of the distributed state, the processing temperature, the sintering temperature and the sintering period, were properly changed to obtained a plurality of microwave transmissive windows respectively composed of a sintered alpha-alumina ceramics body of a ratio of bulk density/theoretical density in the above range. And each of these microwave transmissive windows was examined in the same manner as in the above. As a result, there were obtained satisfactory results similar to those in the above.

As for the reason that there is present such appropriate density for the microwave transmissive window composed of the foregoing sintered alpha-alumina ceramics body, it is considered as follows.

That is, the microwave transmissive window is designed based on the following equation (3) in the case where the microwave mode used is TE 11 mode.

$$\lambda = \frac{2\pi}{\left[\left(\frac{1.84}{a\sqrt{\epsilon}}\right)^2 + \left(\frac{\pi}{b\sqrt{\epsilon}}\right)^2\right]^{\frac{1}{2}}} \quad (3)$$

wherein λ is a resonance wave (12.245 cm in the case where microwave is of 2.45 GHz), a is a radius (cm) of the round-shaped microwave transmissive window, b is a thickness of said microwave transmissive window, and ε is a dielectric constant of said microwave transmissive window.

Now, it is known that there is an interrelation expressed by the equation $\sigma = \sigma_o e \times p(-bp)$ with σ being a flexural strength when the porosity is p, $\sigma_o$ being a flexural strength when the porosity is o, b being a constant and p being a porosity, between the porosity and the strength of a sintered body.

The ratio of bulk density/theoretical density indicates the abudance ratio of blow holes (or pores) present in the sintered body. Particularly in this respect, when the sintered body is small with respect to the ratio of bulk density/theoretical density, the sintered body is of a reduced strength.

In view of the above, the microwave transmissive window composed of a sintered alpha-alumina ceramics body having a small ratio of bulk density/theoretical density is insufficient with respect to the durability to the alkali etching and the sand blasting in the step of removing a film deposited thereon during film formation, and because of this, the surface of such microwave transmissive window is liable to be shaved and/or affected by the alkali, wherein the thickness of the microwave transmissive window is reduced. As a result, the microwave transmissive window becomes such that does not satisfy the above equation and does not allow microwave to effectively transmit therethrough. In this consequence, it is understood that when the microwave transmissive window is one that is composed of a sintered alpha-alumina ceramics body of less than 0.800 in the ratio of bulk density/theoretical density, the microwave transmissive window is not durable in the the repetition of reuse cycle comprising use for the discharging for film formation, removal of the film deposited on the surface of the microwave transmissive window and reuse for the next discharging for film formation. On the other hand, as for the sintered alpha-alumina ceramics body of greater than 0.995 in the ratio of bulk density/theoretical density, it is substantially free of blow holes (or pores) and has a extremely smooth surface. Such sintered alpha-alumina ceramics body has a high strength and can be used as a structural material, but it is not suitable to be used as a microwave transmissive window since the film deposed on such smooth surface is liable to be of a reduced resistance, wherein the film absorbs microwave energy to reduce the transmission factor and as a result, the microwave transmissive window is excessively heated to be damaged or broken.

EXPERIMENT 3

There were prepared a plurality of microwave transmissive window samples respectively composed of an alpha-alumina sintered body respectively having a different mean particle size in the range of 0.3 to 60 μm as shown in Table 5 and a different ratio of bulk density/theoretical density in the range of 0.750 to 0.998 as shown in Table 5 by repeating the procedures of (1) for the preparation of a microwave transmissive window of in Experiment 1, wherein the processing pressure was changed in the range of 300 to 1500 kgf/cm² and the sintering temperature was changed in the range of 700° to 2000° C.

Each of the microwave transmissive window samples obtained in the above was examined in the following manner.

Each of the microwave transmissive window samples was used as the microwave transmissive window of the microwave plasma CVD apparatus shown in FIGS. 1 and 2. And, the microwave transmissive window sample was used to cause discharge in the microwave plasma CVD apparatus shown in FIGS. 1 and 2 under the conditions shown in Table 3; thereafter the microwave transmissive window sample was taken out from the apparatus and it was immersed in a NaOH aqueous solution having a pH value of 13 for an hour while maintaining the system at 60° C., washed with pure water for 30 minutes, followed by drying at 150° C. for an hour; it was then subjected to sand blasting using an abrasive material made of glass at a pressure of 6 kg/cm² for 3 minutes; and then it was installed in the above microwave plasma CVD apparatus and the above discharging was performed. This cycle was repeated 10 times.

(1) Each of the microwave transmissive windows subjected to the repetition of reuse cycle in the above was used as the microwave transmissive window of the microwave plasma CVD apparatus shown in FIGS. 1 and 2. And discharge was caused in each case under the conditions shown in Table 1 to examine the situation of discharge stability, wherein the period of time (endurance time) for the discharge to have been maintained until the discharge discontinued due to breakage of the microwave transmissive window was also examined. The results obtained were collectively shown in Table 5. In Table 5, the mark ⊙ indicates the case of 120 minutes or more for the endurance time, the mark ○ indicates the case of more than 90 minutes but less than 120 minutes for the endurance time, the mark Δ indicates the case of more than 60 minutes but less than 110 minutes for the endurance time, and the mark x indicates the case of more than 30 minutes but less than 60 minutes for the endurance time.

(2) Each of the microwave transmissive windows subjected to the repetition of reuse cycle in the above was used as the microwave transmissive window of the microwave plasma CVD apparatus shown in FIGS. 1 and 2. And discharge was caused in each case under the conditions shown in Table 3 to examine the situation of the stability of discharge caused and ease of causing discharge.

(i) As for the ease of causing discharge, it was evaluated based on the minimum microwave power required for initiating discharge. With respect to the evaluation of the ease of causing discharge, it was performed on the basis of the following criteria: the mark ⊙: the case where the discharge initiating microwave power was less than 1000 W, the mark ○: the case where the discharge initiating microwave power was in the range of 1000 to 1500 W, the mark Δ: the case where the discharge initiating microwave power was in the range of 1500 to 2500 W, and the mark x: the case where the discharge initiating microwave power was higher than 2500 W. The evaluated results obtained were as shown in Table 6.

(ii) In the evaluation of the situation of the stability of discharge caused, the discharging was continuously performed for 4 hours, wherein abnormal phenomena of discharge such as extinction of discharge, occurrence of abnormal discharge, and the like were observed. The evaluation was performed on the basis of the following criteria: the mark ⊙: the case where discharge was stably maintained during the 4 hours, the mark ○: the case where discharge was about to go out several times, the mark Δ: the case where discharge went out several times, and the mark x: the case where discharge frequently went out and discharge was not continued, wherein the discharging was terminated before the 4 hours lapsed. The evaluated results were as shown in Table 6.

From the results shown in Tables 5 and 6, it was found that any of the microwave transmissive windows respectively composed of a sintered alpha-alumina ceramics body having a mean particle size (d) satisfying the equation $0.5\ \mu m \leq d \leq 50\ \mu m$ and a ratio of bulk density ($\rho 2$)/theoretical density ($\rho 1$) satisfying the equation $0.800 \leq \rho 2/\rho 1 \leq 0.995$ markedly excels in discharge stability and durability even upon repeating reuse cycle comprising use for discharging for film formation, removal of the film deposited on the surface of the window by means of an alkali etching technique and a sand blasting technique and use for the next discharging for film formation.

The present invention has been accomplished based on the findings obtained as a result of the above experiments.

The microwave plasma CVD apparatus provided according to the present invention comprises a substantially enclosed deposition chamber having a deposition space including a discharge space, a supporting means for a substrate on which a functional deposited film is to be formed, said supporting means being disposed in said deposition space, means for supplying a raw material gas into said deposition space, means for evacuating the inside of said deposition chamber, and a microwave introducing means for applying microwave energy into said discharge space to form discharge plasma therein, said microwave introducing means comprising a microwave transmissive window to which a waveguide extending from a microwave power source being connected, characterized in that said microwave transmissive window is composed of a sintered ceramics body containing alpha-alumina as a matrix comprised of fine particles with a mean particle size d satisfying the equation $0.5\ \mu m \leq d \leq 50\ \mu m$ and with a ratio of $\rho_2/\rho_1$ between the theoretical density $\rho_1$ and the bulk density $\rho_2$ satisfying the equation $0.800 \leq \rho_2/\rho_1 \leq 0.995$.

As for the sintered alpha-alumina ceramics body by which the microwave transmissive window is constituted in the present invention, it is required to satisfy both the equation $0.5\ \mu m \leq d \leq 50\ \mu m$ with respect to the mean particle size and the equation $0.800 \leq \rho_2/\rho_1 \leq 0.995$ with respect to the ratio of $\rho_2/\rho_1$ between the theoretical density $\rho_1$ and the bulk density $\rho_2$. In the case where the sintered alpha-alumina ceramics body is of less than $0.5\ \mu m$ or of greater than $50\ \mu m$ in mean particle size, the microwave trnsmissive window comprising such sintered alpha-alumina ceramics body is inferior particularly in view of fracture strength. In the case where the microwave transmissive window is one that is composed of a sintered alpha-alumina ceramics body of less than 0.800 in the ratio of bulk density/theoretical density, the microwave transmissive window is not durable in the the repetition of reuse cycle comprising use for the discharging for film formation, removal of the film deposited on the surface of the microwave transmissive window and reuse for the next discharging for film formation. On the other hand, as for the sintered alpha-alumina ceramics body of greater than 0.995 in the ratio of bulk density/theoretical density, it is substantially free of blow holes (or pores) and has a extremely smooth surface. Such sintered alpha-alumina ceramics body has a high strength and can be used as a structural material, but it is not suitable to be used as a microwave transmissive window since the film deposed on such smooth surface is liable to be of a reduced resistance, wherein the film absorbs microwave energy to reduce the transmission factor and as a result, the microwave transmissive window is excessively heated to be damaged or broken.

The microwave transmissive window comprising the foregoing specific sintered alpha-alumina ceramics body in the present invention is maintained in a markedly stable state during discharging for film formation without suffering from external discharged heat radiation, internal temperature rise within the window due to absorption of microwave, and severe thermal impacts. In addition to this, the microwave transmissive window enables to cause and maintain plasma discharge in a stable state continuously over a prolonged period of time. Further in addition, the microwave transmissive window markedly excels in durability upon the repetition of reuse cycle comprising use for discharging for film formation, removal of the film deposited on the surface of the window by means of an alkali etching technique and a sand blasting technique and reuse for the next discharging for film formation.

The foregoing sintered alpha-alumina ceramics body by which the microwave transmissive window is constituted in the present invention is desired to be formed from powdery alpha-alumina by means of a hot rolling technique in the manner as above described. However, in order to improve the resistance against thermal impacts, it is possible to incorporate thereinto a glassy material such as $SiO_2$, $CaO$, $MgO$, or the like in an amount which does not hinder the effects of the microwave transmissive window in the present invention. Further, it is possible to incorporate thereinto an appropriate auxiliary which is capable of contributing to effectively atomizing or evening the particle size of the alpha-alumina or/and which is capable of contributing to preventing particles of the alpha-alumina from being abnormally grown within the range which does not hinder the effects of the microwave transmissive window in the present invention.

The microwave transmissive window comprising the foregoing specific sintered alpha-alumina ceramics body in the present invention is desired to have a leveled surface which is exposed to discharge plasma in order to prevent the resistance of a film deposited on the surface of the microwave transmissive window from being reduced to reduce the microwave transmission of the microwave transmissive window during discharging for film formation.

The microwave plasma CVD apparatus provided with the microwave transmissive window comprising the foregoing specific sintered alpha-alumina ceramics body according to the present invention makes it possible to effectively and continuously form a desirable functional deposited film at an improved yield.

In order to form a functional deposited film by the microwave plasma CVD apparatus of the present invention, there can be used any known gaseous film-forming raw materials, for example, typically gaseous raw materials for the formation of amorphous silicon films such as SiH$_4$, Si$_2$H$_6$, etc., other gaseous raw materials for the formation of other amorphous films such as GeH$_4$, CH$_4$, etc., and mixtures of these gaseous raw materials. In any of these cases, it is possible to use one or more appropriate dilution gases such as H$_2$ gas, Ar gas, He gas, Ne gas, etc.

In addition, it is possible to use gaseous raw materials capable of improving the characteristics or grading the band gap of a functional deposited film to be formed. Such gaseous raw material can include nitrogen-containing raw materials such as NH$_3$, N$_2$, etc., oxygen-containing raw materials such as O$_2$, NO, N$_2$O, etc., hydrocarbons such as CH$_4$, C$_2$H$_2$, C$_2$H$_4$, C$_2$H$_6$, C$_3$H$_8$, etc., fluorides such as SiF$_4$, Si$_2$F$_6$, GeF$_4$, etc., and mixtures of these raw materials.

Further in addition, it is possible to use an appropriate doping gas in order to make the resulting functional deposited film doped with a dopant of p-type or n-type. Such doping gas can include B$_2$H$_6$, BF$_3$, PH$_3$, etc.

As for the inner pressure of the discharge space upon performing the film formation by the microwave plasma CVD apparatus of the present invention, it is properly determined depending upon the related conditions for forming a functional deposited film as desired to form. However, in general, it is preferably 100 mTorr or below, more preferably 50 mTorr or below, or more preferably, 30 mTorr or below.

The substrate used for the film formation by the microwave plasma CVD apparatus of the present invention may be either electroconductive or electrically insulative. The electroconductive substrate can include, for example, metals such as stainless steel, Al, Cr, Mo, Au, In, Nb, Te, V, Ti, Pt, Pd and Fe, or alloys of these metals. The electrically insulative substrate can include, for example, films or sheets of synthetic resins such as polycarbonate, glass, ceramics and paper. It is desired that the electrically insulative substrate is applied with electroconductive treatment to at least one of the surfaces thereof on which a film is to be deposited. In the case of using a cylindrical substrate as the substrate on which a functional deposited film to be formed, there is not any particular restriction for the size thereof. However, in general, there is used such cylindrical substrate that is 20 mm to 50 mm in diameter and 100 mm to 1000 mm in length.

It is possible to form a functional deposited film on each of a plurality of cylindrical substrates at the same time by the microwave plasma CVD apparatus of the present invention. In this case, it is desired for those cylindrical substrates to be arranged so as to circumscribe the discharge space while leaving a space of 1 mm to 50 mm between the adjacent cylindrical substrates. As for the number of the cylindrical substrates to be arranged in the deposition space, there is not any particular restriction, but it is desired to be at least three or preferably, four or above.

In the following, the advantages and the effects of the present invention will be described in more detail with reference to the following examples, which are not intended to restrict the scope of the invention.

EXAMPLE 1

In this example, there were prepared six electrophotographic photosensitive drum samples respectively having an amorphous silicon light receiving layer comprised of a charge injection inhibition layer, a photoconductive layer and a surface layer being stacked in this order on a cylindrical substrate under the film-forming conditions shown in Table 7, using the microwave plasma CVD apparatus shown in FIGS. 1 and 2.

As the microwave transmissive window 102 of the microwave plasma CVD apparatus, there was used a microwave transmissive window of the configuration shown in FIG. 3(B) which comprises (a) a microwave transmissive plate of 1.27 cm in thickness and 9.0 cm in radius composed of a sintered alpha-alumina ceramics body of 3 μm in mean particle size and 0.950 in the ratio of the bulk density/the theoretical density being superposed on (b) a microwave transmissive plate of 0.64 cm in thickness and 10.16 cm in radius composed of a sintered alpha-alumina ceramics body of 3 μm in mean particle size and 0.950 in the ratio of the bulk density/the theoretical density. The microwave transmissive window was prepared by providing powdery alpha-alumina having a predetermined particle distribution obtained by subjecting powdery alpha-alumina of 97% in purity to classification in the same manner as in the case (1) of Experiment 1, processing the powdery alpha-alumina by means of a hot rolling technique at a processing pressure of 1000 kg/cm$^2$ and at a sintering temperature of 1300° C. to thereby obtain a 1.27 cm thick microwave transmissive plate of 9.0 cm in radius composed of a sintered alpha-alumina ceramics body of 3 μm in mean particle size and 0.950 in the ratio of the bulk density/the theoretical density and a 0.64 cm thick microwave transmissive plate of 10.16 cm in radius composed of a sintered alpha-alumina ceramics body of 3 μm in mean particle size and 0.950 in the ratio of the bulk density/the theoretical density, and superposing the former microwave transmissive plate on the latter microwave transmissive plate.

The microwave transmissive window thus prepared was installed in the microwave plasma CVD apparatus such that the remaining surface of the microwave transmissive plate (a) becomes faced to the deposition space.

The six electrophotographic photosensitive drum samples were prepared in the manner as follows.

As the cylindrical substrate, there was used a cylindrical aluminum substrate of 5 mm in thickness, 358 mm in length and 108 mm in outer diameter.

On each of the six substrate holders 105' of the microwave plasma CVD apparatus, there was positioned said cylindrical aluminum substrate. All the substrate holders 105' were made to rotate by revolving the driving motor 111. Thereafter, the inside of the reaction chamber 101 was evacuated by means of the exhaust device (not shown) to thereby bring the discharge space to a vacuum of about 1×10$^{-7}$ Torr. The electric heater 107 was actuated to each cylindrical substrate to a desired temperature and all the cylindrical substrates were maintained at this temperature.

Successively, the film-forming raw material gases for the formation of the charge injection inhibition layer shown in Table 7 were supplied into the discharge space 106 through the gas feed pipe 108 at the respective flow rates shown in Table 7. After the flow rates of all the film-forming raw material gases became stable, the inner pressure of the discharge space 106 was adjusted to a vacuum of 5.0 mTorr. Then, the microwave power source (not shown) was switched on to apply microwave power of 750 W (2.45 GHz in frequency) into the discharge space 106 through the waveguide 103 and the foregoing microwave transmissive window. Wherein, the film-forming raw material gases were excited and decomposed by the action of microwave energy in the discharge space 106 circumscribed by the six cylindrical substrates being rotated to produce neutral radical particles, ion particles, electrons, etc., which were reacted with each other to cause the formation of a deposited film comprised of a-Si:H:B to be the charge injection inhibition layer on each of the cylindrical substrates 105. The film-forming conditions in this case were shown in Table 7.

Then, there was formed the photoconductive layer composed of a-Si:H on the charge injection inhibition layer by repeating the above procedures, except that the film-forming conditions were changed as shown in the column "photoconductive layer" of Table 7.

Successively, there was formed the surface layer composed of a-SiC:H on the photoconductive layer by repeating the foregoing procedures for the formation of the charge injection inhibition layer, except that the film-forming conditions were changed as shown in the column "surface layer" of Table 7.

As for each of the six amorphous silicon electrophotographic photosensitive drum samples thus obtained, (i) appearance of defective images, (ii) the situation of charge retentivity, (iii) the situation of sensitivity, (iv) reproduction of minute lines, (v) appearance of fogged images and (vi) appearance of uneven images were evaluated using a partial modification of a commercially available Canon's electrophotographic copying machine NP 7550 (product by CANON KABUSHIKI KAISHA) for experimental purposes as follows.

(i) Evaluation with Respect to Appearance of Defective images

As for each of the six amorphous silicon electrophotographic photosensitive drum samples, image reproduction was performed using a whole black test chart FY9-9073-000 of CANON KABUSHIKI KAISHA to obtain a copied image. The number of white dots present in the identical area was observed as for each copied image. Using the amorphous silicon electrophotographic photosensitive drum sample which provided the worst evaluation result, the above reproduction procedures were repeated to obtain a plurality of copied images, and the copied images obtained were evaluated evaluated based on the following criteria.

⊚: good, no white dot is present,
○: minute white dots are partly present,
Δ: white dots are present in the entire area but the characters can be distinguished, and
x: white dots are present such that the characters are hardly distinguished.

The evaluated result obtained was shown in Table 9.

(ii) Evaluation with Respect to the Situation of Charge Retentivity

Each of the six amorphous silicon electrophotographic photosensitive drum samples was set to the foregoing electrophotographic copying machine, wherein the surface potential of the drum sample was measured at the position of the development mechanism at constant charging quantity while rotating the drum sample. The measurement of the surface potential was performed at each of the positions of the surface of the drum sample which were spaced by a 3 cm distance in the lengthwise direction, and there was obtained a mean value among the measured values. As for each of the six amorphous silicon electrophotographic photosensitive drum samples, there was observed the value of the surface potential which is the most distant from the mean value obtained in the above, and it was considered as the unevenness in charge retentivity. The drum sample which was the largest with respect to the unevenness in charge retentivity was evaluated based on the following criteria.

⊚: less than 10V, excellent uniformity,
○: less than 20V, good uniformity,
Δ: less than 30V, practically acceptable, and
x: greater than 30V, not sufficient when used in the case of obtaining an extremely high quality image using a high speed copying machine.

The evaluated result obtained was shown in Table 9.

(iii) Evaluation with Respect to the Situation of Sensitivity

Each of the six amorphous silicon electrophotographic photosensitive drum samples was set to the foregoing electrophotographic copying machine, wherein the surface potential of the drum sample was measured at the position of the development mechanism at constant charging quantity and at constant quantity of exposure light while rotating the drum sample. The measurement of the surface potential was performed at each of the positions of the surface of the drum sample which were spaced by a 3 cm distance in the lengthwise direction, and there was obtained a mean value among the measured values. As for each of the six amorphous silicon electrophotographic photosensitive drum samples, there was observed the value of the surface potential which is the most distant from the mean value obtained in the above, and it was considered as the unevenness in charge retentivity. The drum sample which was the largest with respect to the unevenness in charge retentivity was evaluated based on the following criteria.

⊚: less than 3V, excellent uniformity,
○: less than 6V, good uniformity,
Δ: less than 10V, practically acceptable, and
x: greater than 10V, the quality of an image obtained under severe conditions such as high temperature and high humidity conditions or low temperature and low humidity conditions is very possibly reduced.

The evaluated result obtained was shown in Table 9.

(iv) Evaluation with Respect to Reproduction of Minute Lines

As for each of the six amorphous silicon electrophotographic photosensitive drum samples, image reproduction was performed using a test chart FY9-9058-000 of CANON KABUSHIKI KAISHA having minute characters on the entire region to obtain a copied image. As for the copied image obtained, observation was made of whether or not broken minute line is present. In the case where the copied image contained broken minute line, observation was made for the entire of the copied image, and the worst portion with respect to the presence of broken minute line was made as the evaluation result. Using the amorphous silicon electrophotographic photosensitive drum sample which provided the worst evaluation result, the above reproduction procedures were repeated to obtain a plurality of copied images, and the copied images obtained were evaluated evaluated based on the following criteria.

⊚: good, no broken minute line is present,

○: slightly broken minute line is partly present,

Δ: a plurality of broken minute lines are present but the characters can be distinguished, and x: broken minute lines are remarkably present and some characters are hardly distinguished.

The evaluated result obtained was shown in Table 9.

(v) Evaluation with Respect to Appearance of Fogged Images

As for each of the six amorphous silicon electrophotographic photosensitive drum samples, image reproduction was performed using a test chart FY9-9058-000 of CANON KABUSHIKI KAISHA having minute characters on the entire region to obtain a copied image. As for the copied image obtained, observation was made of whether or not fogged character image is present. In the case where the copied image contained fogged character image, observation was made for the entire of the copied image, and the worst portion with respect to the presence of fogged character image was made as the evaluation result. Using the amorphous silicon electrophotographic photosensitive drum sample which provided the worst evaluation result, the above reproduction procedures were repeated to obtain a plurality of copied images, and the copied images obtained were evaluated evaluated based on the following criteria.

⊚: good, no fogged character image is present,

○: slightly fogged character image is partly present,

Δ: a plurality of fogged character images are present present on the entire region but the characters can be distinguished, and x: fogged character images are remarkably present and some characters are hardly distinguished.

The evaluated result obtained was shown in Table 9.

(vi) Evaluation with Respect to Appearance of Uneven Images

As for each of the six amorphous silicon electrophotographic photosensitive drum samples, image reproduction was performed using a half tone test chart FY9-9042-020 of CANON KABUSHIKI KAISHA to obtain a copied image. As for the copied image obtained, observation was made of whether or not uneven image density is present. In the case where the copied image contained uneven image density, observation was made for the entire of the copied image, and the worst portion with respect to the presence of uneven image density was made as the evaluation result. Using the amorphous silicon electrophotographic photosensitive drum sample which provided the worst evaluation result, the above reproduction procedures were repeated to obtain a plurality of copied images, and the copied images obtained were evaluated evaluated based on the following criteria.

⊚: good, free of uneven image density,

○: slight uneven image density is partly present,

Δ: uneven image density is present on the entire region but the characters can be distinguished, and x: uneven image density is remarkably present and some characters are hardly distinguished.

The evaluated result obtained was shown in Table 9.

Comparative Example 1

The procedures of Example 1 were repeated, except that the microwave transmissive window used in Example 1 was replaced by a microwave transmissive window A shown in Table 8 comprising (a') a 1.27 cm thick microwave transmissive plate of 9.0 cm in radius made of a conventional 100% alpha-alumina material without being controlled with respect to the mean particle size and the ratio of bulk density/theoretical density and (b') a 0.64 cm thick microwave transmissive plate of 10.16 cm in radius made of a conventional 100% alpha-alumina material without being controlled with respect to the mean particle size and the ratio of bulk density/theoretical density, the former being superposed on the latter, and the microwave transmissive window was installed in the microwave plasma CVD apparatus such that the remaining surface of the microwave transmissive plate (a') becomes faced to deposition space, to thereby obtain six amorphous silicon electrophotographic photosensitive drum samples.

As for each of the six amorphous silicon electrophotographic photosensitive drum samples thus obtained, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

The evaluated results obtained were collectively shown in Table 9.

Comparative Example 2

The procedures of Example 1 were repeated, except that the microwave transmissive window used in Example 1 was replaced by a microwave transmissive window B shown in Table 8 comprising (a') a 1.27 cm thick microwave transmissive plate of 9.0 cm in radius having a leveled surface which is made of a conventional 100% alpha-alumina material without being controlled with respect to the mean particle size and the ratio of bulk density/theoretical density and (b') a 0.64 cm thick microwave transmissive plate of 10.16 cm in radius made of a conventional 100% alpha-alumina material without being controlled with respect to the mean particle size and the ratio of bulk density/theoretical density, the former being superposed on the latter, and the microwave transmissive window was installed in the microwave plasma CVD apparatus such that the leveled surface of the microwave transmissive plate (a') becomes faced to deposition space, to thereby obtain six amorphous silicon electrophotographic photosensitive drum samples.

As for each of the six amorphous silicon electrophotographic photosensitive drum samples thus obtained, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

The evaluated results obtained were collectively shown in Table 9.

Comparative Example 3

The procedures of Example 1 were repeated, except that the microwave transmissive window used in Example 1 was replaced by a microwave transmissive window C shown in Table 8 comprising (a') a 1.27 cm thick microwave transmissive plate of 9.0 cm in radius made of a conventional alpha-alumina material comprising 95% wt. of alpha-alumina and 5% wt. of glassy component without being controlled with respect to the mean particle size and the ratio of bulk density/theoretical density and (b') a 0.64 cm thick microwave transmissive plate of 10.16 cm in radius made of a conventional alpha-alumina material comprising 95 % wt. of alpha-alumina and 5% wt. of glassy component without being controlled with respect to the mean particle size and the ratio of bulk density/theoretical density, the former being superposed on the latter, and the microwave transmissive window was installed in the microwave plasma CVD apparatus such that the remaining surface of the microwave transmissive plate (a') becomes faced to deposition space, to thereby obtain six amorphous silicon electrophotographic photosensitive drum samples.

As for each of the six amorphous silicon electrophotographic photosensitive drum samples thus obtained, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

The evaluated results obtained were collectively shown in Table 9.

EXAMPLE 2

The procedures of Example 1 for preparing six amorphous silicon electrophotographic photosensitive drum samples were repeated 50 times, wherein after every film formation cycle, the outermost microwave transmissive window situated on the deposition space side was taken out, it was subjected to cleaning treatment for removing the film deposited on the surface thereof by means of an alkali etching technique and a sand blasting technique in the same manner as in Experiment 2, the cleaned microwave transmissive window was returned to the microwave plasma CVD apparatus, and the next cycle comprising the procedures of Example 1 for preparing six amorphous silicon electrophotographic photosensitive drum samples was performed.

As for each of the six amorphous silicon electrophotographic photosensitive drum samples obtained at each of the 1st, 5th, 10th, 20th, 30th, 40th and 50th film formation cycles, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

The evaluated results obtained were collectively shown in Table 10.

Comparative Example 4

The procedures of Comparative Example 1 for preparing six amorphous silicon electrophotographic photosensitive drum samples were repeated 50 times, wherein after every film formation cycle, the outermost microwave transmissive window situated on the deposition space side was taken out, it was subjected to cleaning treatment for removing the film deposited on the surface thereof by means of an alkali etching technique and a sand blasting technique in the same manner as in Experiment 2, the cleaned microwave transmissive window was returned to the microwave plasma CVD apparatus, and the next cycle comprising the procedures of Comparative Example 1 for preparing six amorphous silicon electrophotographic photosensitive drum samples was performed.

As for each of the six amorphous silicon electrophotographic photosensitive drum samples obtained at each of the 1st, 5th, 10th, 20th, 30th, 40th and 50th film formation cycles, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

The evaluated results obtained were collectively shown in Table 11.

Comparative Example 5

The procedures of Comparative Example 2 for preparing six amorphous silicon electrophotographic photosensitive drum samples were repeated 50 times, wherein after every film formation cycle, the outermost microwave transmissive window situated on the deposition space side was taken out, it was subjected to cleaning treatment for removing the film deposited on the surface thereof by means of an alkali etching technique and a sand blasting technique in the same manner as in Experiment 2, the cleaned microwave transmissive window was returned to the microwave plasma CVD apparatus, and the next cycle comprising the procedures of Comparative Example 2 for preparing six amorphous silicon electrophotographic photosensitive drum samples was performed.

As for each of the six amorphous silicon electrophotographic photosensitive drum samples obtained at each of the 1st, 5th, 10th, 20th, 30th, 40th and 50th film formation cycles, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

The evaluated results obtained were collectively shown in Table 12.

Comparative Example 6

The procedures of Comparative Example 3 for preparing six amorphous silicon electrophotographic photosensitive drum samples were repeated 50 times, wherein after every film formation cycle, the outermost microwave transmissive window situated on the deposition space side was taken out, it was subjected to cleaning treatment for removing the film deposited on the surface thereof by means of an alkali etching technique and a sand blasting technique in the same manner as in Experiment 2, the cleaned microwave transmissive window was returned to the microwave plasma CVD apparatus, and the next cycle comprising the procedures of Comparative Example 3 for preparing six amorphous silicon electrophotographic photosensitive drum samples was performed.

As for each of the six amorphous silicon electrophotographic photosensitive drum samples obtained at each of the 1st, 5th, 10th, 20th, 30th, 40th and 50th film formation cycles, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

The evaluated results obtained were collectively shown in Table 13.

Total Evaluation Based on the Results Obtained in Example 2 and Comparative Examples 4 to 6

From the results shown in Tables 10 to 13, the following facts were found. That is, (i) in the case where a conventional microwave transmissive window is used in the formation of a relatively thick functional deposited film by means of a microwave, there can be obtained a desirable functional deposited film of the quality similar to that of a functional deposited film obtained by using the microwave transmissive window composed of the foregoing specific sintered alpha-alumina ceramics body according to the present invention as long as the repetition of the reuse cycle comprising use for film formation, removal of the film deposited on the surface of the microwave transmissive window by means of an alkali etching technique and a sand blasting technique and reuse for the next film formation is small, except the case of Comparative Example 4 wherein the results were the worse as apparent from what shown in Table 11; (ii) however in the case of the conventional microwave transmissive window, as the repetition of the reuse cycle increases, there are provided problems that discharge is hardly caused and discharge is not stably maintained, wherein excessive microwave power is required to apply in order to cause and maintain discharge where the resulting functional deposited film becomes accompanied by defects, discharge generated becomes unstable to cause removal of the film deposited on the surface of the microwave transmissive window, resulting in increasing the defects of the functional deposited film formed, and/or the microwave transmissive window is damaged or broken.

On the other hand, as apparent from what shown in Table 10, it is understood that in the case of the microwave transmissive window composed of the foregoing specific sintered alpha-alumina ceramics body according to the present invention, it always stably maintains its function as the microwave introducing window in the formation of a functional deposited film by a microwave plasma CVD process even upon performing the repetition of the reuse cycle great many times, wherein stable formation of a high quality functional deposited film is secured.

EXAMPLE 3

In this example, as the microwave transmissive window 102 of the microwave plasma CVD apparatus, there were provided 15 different microwave transmissive window samples (hereinafter referred to as window samples Nos. 1 to 15) respectively comprising (a) a microwave transmissive plate of 1.27 cm in thickness and 9.0 cm in radius composed of a sintered alpha-alumina ceramics body containing a glassy component of $SiO_2$, MgO or CaO in a different amount of 2% wt., 5% wt., 10% wt., 13% wt. or 15% wt. which is of 3 $\mu$m in mean particle size and 0.950 in the ratio of the bulk density/the theoretical density being superposed on (b) a microwave transmissive plate of 0.64 cm in thickness and 10.16 cm in radius composed of a sintered alpha-alumina ceramics body containing a glassy component of $SiO_2$, MgO or CaO in a different amount of 2% wt., 5% wt., 10% wt., wt. or 15% wt. which is of 3 $\mu$m in mean particle size and 0.950 in the ratio of the bulk density/the theoretical density.

Each of the window samples Nos. 1 to 15 was prepared by providing (i) powdery alpha-alumina having a predetermined particle distribution obtained by subjecting powdery alpha-alumina of 97% in purity to classification in the same manner as in the case (1) of Experiment 1 and (ii) powdery glassy material of $SiO_2$, MgO or CaO having a predetermined mean particle size, mixing the powdery alpha-alumina (i) and the powdery glassy material (ii) at a predetermined mixing ratio to obtain a mixture, and processing the resultant mixture by means of a hot rolling technique at a processing pressure of 1000 kg/cm$^2$ and at a sintering temperature of 1300° C. to thereby obtain a 1.27 cm thick microwave transmissive plate of 9.0 cm in radius composed of a sintered alpha-alumina ceramics body containing a glassy component of $SiO_2$, MgO or CaO in a different amount of 2% wt., 5% wt., 10% wt., 13% wt. or 15% wt. which is of 3 $\mu$m in mean particle size and 0.950 in the ratio of the bulk density/the theoretical density and a 0.64 cm thick microwave transmissive plate of 10.16 cm in radius composed of a sintered alpha-alumina ceramics body containing a glassy component of $SiO_2$, MgO or CaO in a different amount of 2% wt., 5% wt., 10% wt., 13% wt. or 15% wt. which is of of 3 $\mu$m in mean particle size and 0.950 in the ratio of the bulk density/the theoretical density, and superposing the former microwave transmissive plate on the latter microwave transmissive plate.

Each of the 15 microwave transmissive window samples (window samples Nos. 1 to 15) thus prepared was installed in the microwave plasma CVD apparatus such that the remaining surface of the microwave transmissive plate (a) becomes faced to the deposition space.

Then, the procedures of Example 1 for preparing six amorphous silicon electrophotographic photosensitive drum samples were repeated 50 times, wherein after every film formation cycle, the outermost microwave transmissive window situated on the deposition space side was taken out, it was subjected to cleaning treatment for removing the film deposited on the surface thereof by means of an alkali etching technique and a sand blasting technique in the same manner as in Experiment 2, the cleaned microwave transmissive window was returned to the microwave plasma CVD apparatus, and the next cycle comprising the procedures of Example 1 for preparing six amorphous silicon electrophotographic photosensitive drum samples was performed.

As for each of the six amorphous silicon electrophotographic photosensitive drum samples obtained at each of the 1st, 5th, 10th, 20th, 30th, 40th and 50th film formation cycles, (i) appearance of defective images, (ii) the situation of charge retentivity, (iii) the situation of sensitivity, (iv) reproduction of minute lines, (v) appearance of fogged images and (vi) appearance of uneven images were evaluated in the same manner as in Example 1.

As a result, there were obtained satisfactory results quite similar to those obtained in Example 2 in the case where the microwave transmissive window composed of the sintered alpha-alumina ceramics body containing a glassy component of $SiO_2$, MgO or CaO in a amount of 10% wt. or below was used. However, in the case where the microwave transmissive window composed of the sintered alpha-alumina ceramics body containing a glassy component of $SiO_2$, MgO or CaO in a amount of exceeding 10% wt., the results obtained were quite similar to those obtained in Comparative Example 6 and were not satisfactory.

TABLE 1

| gas used | Ar |
| --- | --- |
| inner pressure | 20 mTorr |
| microwave power | 2100 W $\times$ 2 = 4200 W |

TABLE 2

| sample no. | discharge durability | mean particle size of particles of the sintered alpha-almina ceramics body |
|---|---|---|
| 1 | X | 0.30 |
| 2 | ○ | 0.50 |
| 3 | ⊚ | 1.00 |
| 4 | ⊚ | 3.00 |
| 5 | ⊚ | 5.00 |
| 6 | ⊚ | 10.00 |
| 7 | ⊚ | 15.00 |
| 8 | ⊚ | 30.00 |
| 9 | ○ | 50.00 |
| 10 | Δ | 60.00 |

TABLE 3

| | |
|---|---|
| gas used | Ar + SiH₄ |
| inner pressure | 20 mTorr |
| microwave power | 500 W × 2 = 1000 W |

TABLE 4

| Sample no. | 0 | 1 | 2 | | 4 | | 6 | | 8 | | 10 | | | | bulk density/theoretical density |
|---|---|---|---|---|---|---|---|---|---|---|---|---|---|---|---|
| 11 | ⊚ | Δ | ○ | Δ | ○ | Δ | ○ | Δ | Δ | X | Δ | X | X | X | 0.75 |
| 12 | ⊚ | ⊚ | ⊚ | ⊚ | ⊚ | ○ | ⊚ | ○ | ○ | ○ | ○ | ○ | ○ | ○ | 0.80 |
| 13 | ⊚ | ⊚ | ⊚ | ⊚ | ⊚ | ⊚ | ⊚ | ⊚ | ⊚ | ⊚ | ⊚ | ○ | ⊚ | ○ | 0.85 |
| 14 | ⊚ | ⊚ | ⊚ | ⊚ | ⊚ | ⊚ | ⊚ | ⊚ | ⊚ | ⊚ | ⊚ | ⊚ | ⊚ | ⊚ | 0.90 |
| 15 | ⊚ | ⊚ | ⊚ | ⊚ | ⊚ | ⊚ | ⊚ | ⊚ | ⊚ | ⊚ | ⊚ | ⊚ | ⊚ | ⊚ | 0.95 |
| 16 | ⊚ | ⊚ | ⊚ | ⊚ | ⊚ | ⊚ | ⊚ | ⊚ | ⊚ | ⊚ | ⊚ | ⊚ | ⊚ | ⊚ | 0.99 |
| 17 | ⊚ | ○ | ⊚ | ○ | ⊚ | ○ | ⊚ | ○ | ⊚ | ○ | ⊚ | ○ | ⊚ | ○ | 0.995 |
| 18 | ⊚ | X | ⊚ | X | ⊚ | X | ⊚ | X | ⊚ | X | ⊚ | X | ⊚ | X | 0.998 | note:
ease of causing discharge
discharge stability

TABLE 5

| mean particle size | *density ratio | | | | | | | |
|---|---|---|---|---|---|---|---|---|
| | 0.75 | 0.80 | 0.85 | 0.90 | 0.95 | 0.99 | 0.995 | 0.998 |
| 0.30 | X | X | X | X | X | X | X | X |
| 0.50 | X | Δ | Δ | Δ | Δ | Δ | Δ | X |
| 1.00 | X | ○ | ○ | ⊚ | ⊚ | ⊚ | ○ | X |
| 3.00 | X | ○ | ○ | ⊚ | ⊚ | ⊚ | ○ | Δ |
| 5.00 | Δ | ○ | ○ | ⊚ | ⊚ | ⊚ | ○ | Δ |
| 10.00 | Δ | ○ | ○ | ⊚ | ⊚ | ⊚ | ○ | Δ |
| 15.00 | Δ | ○ | ○ | ⊚ | ⊚ | ⊚ | ○ | Δ |
| 30.00 | Δ | ○ | ○ | ⊚ | ⊚ | ⊚ | ○ | X |
| 50.00 | X | ○ | ○ | ○ | ○ | ○ | ○ | X |
| 60.00 | X | X | X | Δ | Δ | Δ | X | X |

*bulk density/theoretical density

TABLE 6

| mean particle size | *density ratio | | | | | | | | | | | | | |
|---|---|---|---|---|---|---|---|---|---|---|---|---|---|---|
| | 0.750 | | 0.800 | | 0.850 | | 0.900 | | 0.950 | | 0.990 | | 0.995 | 0.998 |
| 0.30 | X | X | X | X | X | X | X | X | X | X | X | X | X | X |
| 0.50 | X | X | Δ | Δ | Δ | ○ | ○ | ○ | ○ | ○ | ○ | ○ | Δ | Δ | X |
| 1.00 | X | X | ○ | Δ | ○ | ⊚ | ⊚ | ⊚ | ⊚ | ⊚ | ⊚ | ○ | ⊚ | Δ | ⊚ | X |
| 3.00 | X | X | ○ | ○ | ⊚ | ⊚ | ⊚ | ⊚ | ⊚ | ⊚ | ⊚ | ⊚ | ○ | ⊚ | X |
| 5.00 | Δ | Δ | ○ | ○ | ⊚ | ⊚ | ⊚ | ⊚ | ⊚ | ⊚ | ⊚ | ⊚ | ○ | ⊚ | X |
| 10.00 | Δ | X | ○ | ○ | ⊚ | ⊚ | ⊚ | ⊚ | ⊚ | ⊚ | ⊚ | ⊚ | ○ | ⊚ | X |
| 15.00 | Δ | X | ○ | ○ | ⊚ | ⊚ | ⊚ | ⊚ | ⊚ | ⊚ | ⊚ | ⊚ | ○ | ⊚ | X |
| 30.00 | X | X | ○ | Δ | ○ | ⊚ | ⊚ | ⊚ | ⊚ | ⊚ | ⊚ | ⊚ | ○ | ⊚ | X |
| 50.00 | X | X | Δ | Δ | ○ | ○ | ○ | ○ | ○ | ○ | ○ | ○ | ○ | X |
| 60.00 | X | X | X | X | X | Δ | Δ | Δ | Δ | X | X | X | X | X |

*bulk density/theoretical density
note:
ease of causing discharge
discharge stability

TABLE 7

| | layer constitution | | |
|---|---|---|---|
| film-forming conditions | charge injection inhibition layer | photo-conductive layer | surface layer |
| raw material gas used and its flow rate | | | |
| SiH₄ (sccm) | 350 | 350 | 70 |
| He (sccm) | 500 | 500 | 150 |
| B₂H₆ (ppm) | 1000 | 0 | 0 |
| CH₄ (sccm) | 0 | 0 | 300 |
| inner pressure (mTorr) | 5.00 | 5.00 | 3.00 |
| microwave power (W) | 750 | 750 | 750 |
| layer thickness (μm) | 3 | 25 | 0.5 |

TABLE 8

| microwave transmissive window | constitution | remarks |
|---|---|---|
| A | alpha-alumina 100% | |
| B | alpha-alumina 100% | with a leveled surface |
| C | alpha-alumina 95%, glassy component 5% | |

TABLE 9

| | Example 1 | Comparative Example 1 | Comparative Example 2 | Comparative Example 3 |
|---|---|---|---|---|
| defective image | ⊚ | X | ⊚ | ○ |
| unevenness in sensitivity | ⊚ | Δ | ○ | ⊚ |
| reproduction of minute lines | ⊚ | ○ | ⊚ | ⊚ |
| appearance of fogged image | ⊚ | Δ | ⊚ | ⊚ |
| appearance of uneven density image | ⊚ | Δ | ○ | ⊚ |
| unevenness in charge retentivity | ⊚ | X | ⊚ | ○ |

TABLE 9-continued

|  | Example 1 | Comparative Example 1 | Comparative Example 2 | Comparative Example 3 |
|---|---|---|---|---|
| total evaluation | ⊙ | Δ | ⊙ | ⊙ |

TABLE 10

| evaluation item | number of cycle | | | | | | |
|---|---|---|---|---|---|---|---|
| | 1 | 5 | 10 | 20 | 30 | 40 | 50 |
| defective image | ⊙ | ⊙ | ⊙ | ⊙ | ⊙ | ○ | ○ |
| unevenness in sensitivity | ⊙ | ⊙ | ⊙ | ⊙ | ⊙ | ⊙ | ⊙ |
| reproduction of minute lines | ⊙ | ⊙ | ⊙ | ⊙ | ⊙ | ⊙ | ⊙ |
| appearance of fogged image | ⊙ | ⊙ | ⊙ | ⊙ | ⊙ | ⊙ | ○ |
| appearance of uneven density image | ⊙ | ⊙ | ⊙ | ⊙ | ○ | ○ | ○ |
| unevenness in charge retentivity | ⊙ | ⊙ | ⊙ | ⊙ | ⊙ | ⊙ | ○ |
| total evaluation | ⊙ | ⊙ | ⊙ | ⊙ | ⊙ | ⊙ | ○ |

TABLE 11

| evaluation item | number of cycle | | | | | | |
|---|---|---|---|---|---|---|---|
| | 1 | 5 | 10 | 20 | 30 | 40 | 50 |
| defective image | X | X | X | X | — | — | — |
| unevenness in sensitivity | Δ | Δ | Δ | X | — | — | — |
| reproduction of minute lines | ○ | ○ | ○ | Δ | — | — | — |
| appearance of fogged image | Δ | Δ | Δ | X | — | — | — |
| appearance of uneven density image | Δ | Δ | X | X | — | — | — |
| unevenness in charge retentivity | X | X | X | X | — | — | — |
| total evaluation | Δ | Δ | X | X | X | X | X | note: the mark "—" means the case where the microwave transmissive window broken during film formation

TABLE 12

| evaluation item | number of cycle | | | | | | | | |
|---|---|---|---|---|---|---|---|---|---|
| | 1 | 5 | 10 | 20 | 30 | 35 | 40 | 45 | 50 |
| defective image | ⊙ | ⊙ | ⊙ | ○ | Δ | Δ | X | — | — |
| unevenness in sensitivity | ○ | ○ | ○ | ○ | Δ | Δ | X | — | — |
| reproduction of minute lines | ⊙ | ⊙ | ⊙ | ⊙ | ⊙ | ○ | ○ | — | — |
| appearance of fogged image | ⊙ | ⊙ | ⊙ | ○ | ○ | ○ | Δ | — | — |
| appearance of uneven density image | ○ | ○ | ○ | ○ | Δ | X | X | — | — |
| unevenness in charge retentivity | ⊙ | ○ | ○ | Δ | Δ | Δ | Δ | — | — |
| total evaluation | ⊙ | ⊙ | ⊙ | ○ | Δ | Δ | X | X | X | note: the mark "—" means the case where the microwave transmissive window broken during film formation

TABLE 13

| evaluation item | number of cycle | | | | | | |
|---|---|---|---|---|---|---|---|
| | 1 | 5 | 10 | 20 | 30 | 40 | 50 |
| defective image | ○ | ○ | ○ | ○ | Δ | X | X |
| unevenness in sensitivity | ⊙ | ○ | ○ | ○ | Δ | X | X |
| reproduction of minute lines | ⊙ | ⊙ | ⊙ | ⊙ | ○ | ○ | ○ |
| appearance of fogged image | ⊙ | ⊙ | ⊙ | ⊙ | ○ | Δ | Δ |
| appearance of uneven density image | ⊙ | ⊙ | ⊙ | ⊙ | ○ | ○ | Δ |
| unevenness in charge retentivity | ○ | ○ | ○ | ○ | ○ | Δ | X |
| total evaluation | ⊙ | ⊙ | ⊙ | ⊙ | ○ | Δ | X |

What we claim is:

1. A microwave plasma CVD apparatus for forming a functional deposited film, said apparatus comprising a substantially enclosed deposition chamber having a deposition space including a discharge space, a supporting means for a substrate on which a film is to be formed, said supporting means being disposed in said deposition space, means for supplying a film-forming raw material gas into said deposition space, means for evacuating the inside of said deposition chamber, and a microwave introducing means for applying microwave energy into said discharge space to form discharge plasma therein, said microwave introducing means comprising a microwave transmissive window to which a waveguide extending from a microwave power source being connected, characterized in that said microwave transmissive window is composed of a sintered alpha-alumina ceramics body containing alpha-alumina as a matrix comprised of fine particles with a mean particle size d satisfying the equation $0.5\ \mu m \leq d \leq 50\ \mu m$ and with a ratio of $\rho_2/\rho_1$ between the theoretical density $\rho_1$ and the bulk density $\rho_2$ satisfying the equation $0.800 \leq \rho_2/\rho_1 \leq 0.995$.

2. The microwave plasma CVD apparatus according to claim 1, wherein the sintered alpha-alumina ceramics body contains a an inorganic material selected from the group consisting of $SiO_2$, CaO and MgO.

3. The microwave plasma CVD apparatus according to claim 2, wherein the amount of the glassy component contained in the sintered alpha-alumina ceramics body is 10% by weight or below.

4. The microwave plasma CVD apparatus according to claim 1, wherein the microwave transmissive window comprises a plurality of microwave transmissive plates respectively composed of a sintered alpha-alumina ceramics body containing alpha-alumina as a matrix comprised of fine particles with a mean particle size d satisfying the equation $0.5\mu m \leq d \leq 50\ \mu m$ and with a ratio of $\rho_2/\rho_1$ between the theoretical density $\rho_1$ and the bulk density $\rho_2$ satisfying the equation $0.800 \leq \rho_2/\rho_1 \leq 0.995$.

* * * * *

UNITED STATES PATENT AND TRADEMARK OFFICE
CERTIFICATE OF CORRECTION

PATENT NO. : 5,360,484

DATED : November 1, 1994

INVENTOR(S) : YASUYOSHI TAKAI, ET AL.

It is certified that error appears in the above-indentified patent and that said Letters Patent is hereby corrected as shown below:

On the title page, item

[56] References Cited

U.S. Patent Documents, "4,930,442  9/1990  Iida et al." should read --4,930,442  6/1990  Iida et al.--; and Foreign Patent Documents, "01-56873  3/1989  Japan" should be deleted.

COLUMN 2

Line 29, "full-use" should read --full use--.

COLUMN 3

Line 4, "reflected" should read --being reflected--;

Line 28, "cross section" should read --cross-sectional--; and

Line 48, "vacuum-tight" should read --vacuum-seal--.

COLUMN 5

Line 9, "And, this" should read --This--; and

Line 65, "Other" should read --Another--.

COLUMN 6

Line 41, "cross section" should read --cross-sectional--; and

Line 53, "cross section" should read --cross-sectional--.

UNITED STATES PATENT AND TRADEMARK OFFICE
CERTIFICATE OF CORRECTION

PATENT NO. : 5,360,484
DATED : November 1, 1994
INVENTOR(S) : Yasuyoshi Takai, et al It is certified that error appears in the above-indentified patent and that said Letters Patent is hereby corrected as shown below:

COLUMN 7

Line 39, "cross section" should read --cross-sectional--;

Line 57, "vacuum-tight" should read --vacuum-seal--.

COLUMN 8

Line 22, "entire" should read --entirety--;

Line 32, "2α" should read --2a--;

Line 42, "a" should read --10--; and

Line 43, "body." should read --bodies.--.

COLUMN 9

Line 28, "density" should read --densities--;

Line 29, "density" should read --densities--;

Line 37, "And discharge" should read --Discharge--;

Line 43, "were" should read --are--;

Line 66, "a" should be deleted;

Line 67, "body" should read --bodies--; and "a" should be deleted; and

Line 68, "size" should read --sizes--.

UNITED STATES PATENT AND TRADEMARK OFFICE
CERTIFICATE OF CORRECTION

PATENT NO. : 5,360,484
DATED : November 1, 1994
INVENTOR(S) : Yasuyoshi Takai, et al It is certified that error appears in the above-indentified patent and that said Letters Patent is hereby corrected as shown below:

COLUMN 10

Line 5, "each of" should read --both--; and "outer most" should read --outermost--;

Line 7, "was" should read --were--;

Line 14, "varried" should read --varied--;

Line 15, "varried" should read --varied--;

Line 17, "of" should read --for--;

Line 50, "For the reason of this," should read --For this reason,--; and

Line 56, "what" should read --what is--.

COLUMN 11

Line 6, "is is" should read --is--;

Line 16, before "respectively" insert --each--; and

Line 31, "2. And" should read --2, and--.

COLUMN 12

Line 36, "what shown In" should read --what is shown in--;

Line 56, "And" should be deleted; and

Line 57, "each" should read --Each--.

UNITED STATES PATENT AND TRADEMARK OFFICE
CERTIFICATE OF CORRECTION

PATENT NO. : 5,360,484
DATED : November 1, 1994
INVENTOR(S) : Yasuyoshi Takai, et al It is certified that error appears in the above-indentified patent and that said Letters Patent is hereby corrected as shown below:

COLUMN 13

Line 36, "microwave" should read --microwaves--;

Line 41, "the the" should read --the--;

Line 63, "after "body" insert --each--; and

Line 68, "of" should read --as--.

COLUMN 14

Line 11, And, the" should read --The--;

Line 30, "And discharge" should read --Discharge--;

Line 50, "And discharge" should read --Discharge--; and

Line 67, "were" should read --are--.

COLUMN 15

Line 15, "were" should read --are--.

COLUMN 19

Line 14, "were" should read --are--;

Line 34, "Canon's" should read --Canon--; and

Line 50, "evaluated" should be deleted.

UNITED STATES PATENT AND TRADEMARK OFFICE
CERTIFICATE OF CORRECTION

PATENT NO. : 5,360,484
DATED : November 1, 1994
INVENTOR(S) : Yasuyoshi Takai, et al It is certified that error appears in the above-indentified patent and that said Letters Patent is hereby corrected as shown below:

COLUMN 20

Line 17, "was" should read --is--;

Line 48, "was" should read --is--; and

Line 67, "evaluated" should be deleted.

COLUMN 21

Line 6, "was" should read --is--;

Line 25, "evaluated evaluated" should read --evaluated--;

Line 30, "present" should be deleted;

Line 34, "was" should read --is--;

Line 52, "evaluated evaluated" should read --evaluated--; and

Line 60, "was" should read --is--.

COLUMN 22

Line 11, "becomes faced to" should read --faced the--;

Line 41, delete "be-";

Line 42, "comes faced to" should read --faced the--; and

Line 52, "were" should read --are--.

UNITED STATES PATENT AND TRADEMARK OFFICE
CERTIFICATE OF CORRECTION

PATENT NO. : 5,360,484
DATED : November 1, 1994
INVENTOR(S) : Yasuyoshi Takai, et al It is certified that error appears in the above-indentified patent and that said Letters Patent is hereby corrected as shown below:

COLUMN 23

Line 6, "becomes faced to" should read --faced the--;

Line 17, "were" should read --are--; and

Line 44, "were" should read --are--.

COLUMN 24

Line 4, "were" should read --are--;

Line 32, "were" should read --are--; and

Line 60, "were" should read --are--.

COLUMN 26

Line 24, "becomes faced to" should read --faced--.

UNITED STATES PATENT AND TRADEMARK OFFICE
CERTIFICATE OF CORRECTION

PATENT NO. : 5,360,484
DATED : November 1, 1994
INVENTOR(S) : Yasuyoshi Takai, et al It is certified that error appears in the above-indentified patent and that said Letters Patent is hereby corrected as shown below:

COLUMN 30

Line 32, "a" should be deleted.

Signed and Sealed this

Twenty-seventh Day of June, 1995

Attest:

BRUCE LEHMAN

Attesting Officer

Commissioner of Patents and Trademarks